US012695419B2

(12) United States Patent　　　(10) Patent No.:　US 12,695,419 B2
Erdogan et al.　　　　　　　　　(45) Date of Patent:　　　Jul. 28, 2026

(54) METHODS AND APPARATUS TO ADJUST LINEAR REDRIVER DEVICES

(71) Applicant: Texas Instruments Incorporated, Dallas, TX (US)

(72) Inventors: Mustafa U. Erdogan, Allen, TX (US); Douglas Edward Wente, Murphy, TX (US); Amit Rane, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/790,834

(22) Filed: Jul. 31, 2024

(65) Prior Publication Data

US 2026/0039246 A1　　　Feb. 5, 2026

(51) Int. Cl.
*H03B 5/04*　　　　　(2006.01)

(52) U.S. Cl.
CPC ..................................... *H03B 5/04* (2013.01)

(58) Field of Classification Search
CPC ................................... H04B 3/14; H03B 5/04
USPC .......................................... 330/254; 331/183
See application file for complete search history.

(56) References Cited

U.S. PATENT DOCUMENTS

| | | | | |
|---|---|---|---|---|
| 6,219,380 | B1 * | 4/2001 | Wang | H04B 14/026 |
| | | | | 332/112 |
| 2007/0241821 | A1 * | 10/2007 | Dally | H03G 3/3052 |
| | | | | 330/279 |

| | | | | |
|---|---|---|---|---|
| 2008/0129378 | A1 * | 6/2008 | Park | H03G 3/3036 |
| | | | | 330/140 |
| 2009/0206962 | A1 * | 8/2009 | Chou | H04B 3/14 |
| | | | | 333/28 R |
| 2010/0237943 | A1 * | 9/2010 | Kim | H03G 3/3052 |
| | | | | 330/254 |
| 2014/0269881 | A1 * | 9/2014 | He | H04L 25/03878 |
| | | | | 375/231 |
| 2019/0305810 | A1 * | 10/2019 | Pham | H04L 25/0272 |
| 2022/0255294 | A1 | 8/2022 | Fujita | |
| 2022/0286334 | A1 | 9/2022 | Cornelius | |
| 2024/0195374 | A1 | 6/2024 | Iotti | |

OTHER PUBLICATIONS

Palermo, Sam "ECEN 689, High-Speed Links Circuits and Systems, Lab5-Equalization Circuits," retrieved from https://people.engr.tamu.edu/spalermo/ecen689/ECEN689_lab5.pdf on Jul. 29, 2024, 12 pages.

(Continued)

*Primary Examiner* — Joseph Chang
(74) *Attorney, Agent, or Firm* — Xianghui Huang; Frank D. Cimino

(57)　　　　　　ABSTRACT

An example apparatus includes: variable gain amplifier (VGA) circuitry having: an input terminal, an output terminal, and a control terminal; and peak detector circuitry having: an input terminal coupled to the output terminal of the VGA circuitry; an output terminal coupled to the control terminal of the VGA circuitry; the peak detector circuitry configured to: compare a voltage on the output of the VGA circuitry to an offset voltage; and adjust, responsive to the comparison, a gain of the VGA circuitry.

20 Claims, 14 Drawing Sheets

(56)         References Cited

OTHER PUBLICATIONS

Texas Instruments, TUSB2046x 4-Port Hub for the Universal Serial Bus With Optional Serial EEPROM Interface, technical sheet TUSB2046B, TUSB20461, dated Feb. 2000, Revised Jun. 2017, 33 pages.

Liu Haiqi et al: "A 5-GB/s Serial-Link Redriver With Adaptive Equalizer and Transmitter Swing Enhancement", IEEE Transactions on Circuits and Systems I: Regular Papers, IEEE, US, vol. 61, No. 4, Apr. 2, 2014 (Apr. 2, 2014), pp. 1001-1011, XP011544196, ISSN: 1549-8328, DOI: 10.1109/TCSI.2013.2283675 [retrieved on Mar. 25, 2014] abstract; figures 3,7.

Salam Elahmadi et al: "An 11.1 Gbps Analog PRML Receiver for Electronic Dispersion Compensation of Fiber Optic Communications", IEEE Journal of Solid-State Circuits, IEEE, USA, vol. 45, No. 7, Jul. 2, 2010 (Jul. 2, 2010), pp. 1330-1344, XP011312122, ISSN: 0018-9200, DOI: 10.1109/JSSC.2010.2049460 p. 1332, left-hand col. paragraph 3—3 p. 1333, left-hand column paragraph 1; figures 2,3.

* cited by examiner

INPUT VOLTAGE TO
HSC CIRCUITRY 208
524

$(V_{OUT(P)} - V_{OUT(N)})$
530

POSITIVE COMPARATOR
REFERENCE
526

$(V_{COMP(P)} - V_{COMP(N)})$
532

$V_{SLICE}$
534

$V_{SLICE}$
538

NEGATIVE COMPARATOR
REFERENCE
528

$(V_{COMP(P)} - V_{COMP(N)})$
536

VOD=1500 mV, COUNTER=0
VOD=1400 mV, COUNTER=0
VOD=1300 mV, COUNTER=3
VOD=1200 mV, COUNTER=7
VOD=1100 mV, COUNTER=7
VOD=1000 mV, COUNTER=10
VOD=900 mV, COUNTER=7

$V_{OUT(P)} - V_{OUT(N)}$

700

VOLTAGE

TIME

APPLICATION OF AEQ WITH OFFSET AND AGC

METHODS AND APPARATUS TO ADJUST LINEAR REDRIVER DEVICES

TECHNICAL FIELD

This description relates generally to redriver circuits and, more particularly, to methods and apparatus to adjust linear redriver devices.

BACKGROUND

Wired communications technology enables a wide variety of electronic devices (e.g., mobile phones, tablets, laptops, etc.) to support the execution of increasingly diverse and complex workloads. The secure, efficient, and accurate exchange of information over a wired medium includes technical challenges. One such technical challenge is attenuation, which refers to the continued dissipation of a signal as it traverses a medium. In some use cases, the amount of attenuation that occurs is dependent on the frequency of the signal.

SUMMARY

In a first example, a redriver device also includes variable gain amplifier (VGA) having: an input terminal, an output terminal, and a control terminal. The device also includes peak detector circuitry having: an input terminal coupled to the output terminal of the VGA circuitry, an output terminal coupled to the control terminal of the VGA circuitry, wherein the peak detector is circuitry configured to: compare voltage on the output of the VGA circuitry to an offset voltage; and adjust, responsive to the comparison, a gain of the VGA circuitry.

In a second example, a redriver device includes equalizer circuitry having: an input terminal configured to receive an input signal, an output terminal, and a control terminal. The device also includes variable gain amplifier (VGA) circuitry having: The device also includes an input terminal coupled to the output terminal of the equalizer circuitry. The device also includes an output terminal. The device also includes a control terminal. The device also includes transmitter driver circuitry having: an input terminal coupled to the output terminal of the VGA circuitry, an output terminal provided to transmit the output signal. The device also includes peak detector circuitry having: a second input terminal coupled to the output terminal of the transmitter driver circuitry, an output terminal coupled to the control terminal of the VGA circuitry, wherein the peak detector circuitry is configured to: compare a voltage on the output terminal of the VGA circuitry to an offset voltage; and adjust, responsive to the comparison, a gain value of the VGA circuitry.

In a third example, programmable circuitry also includes counter circuitry configured to generate a counter value responsive to a comparison between an output signal produced by a redriver circuit and an offset voltage, the offset voltage corresponding to a linearity boundary of the redriver circuit; a finite state machine (FSM) configured to adjust a gain value of VGA circuitry responsive to the counter value.

Figure 1:
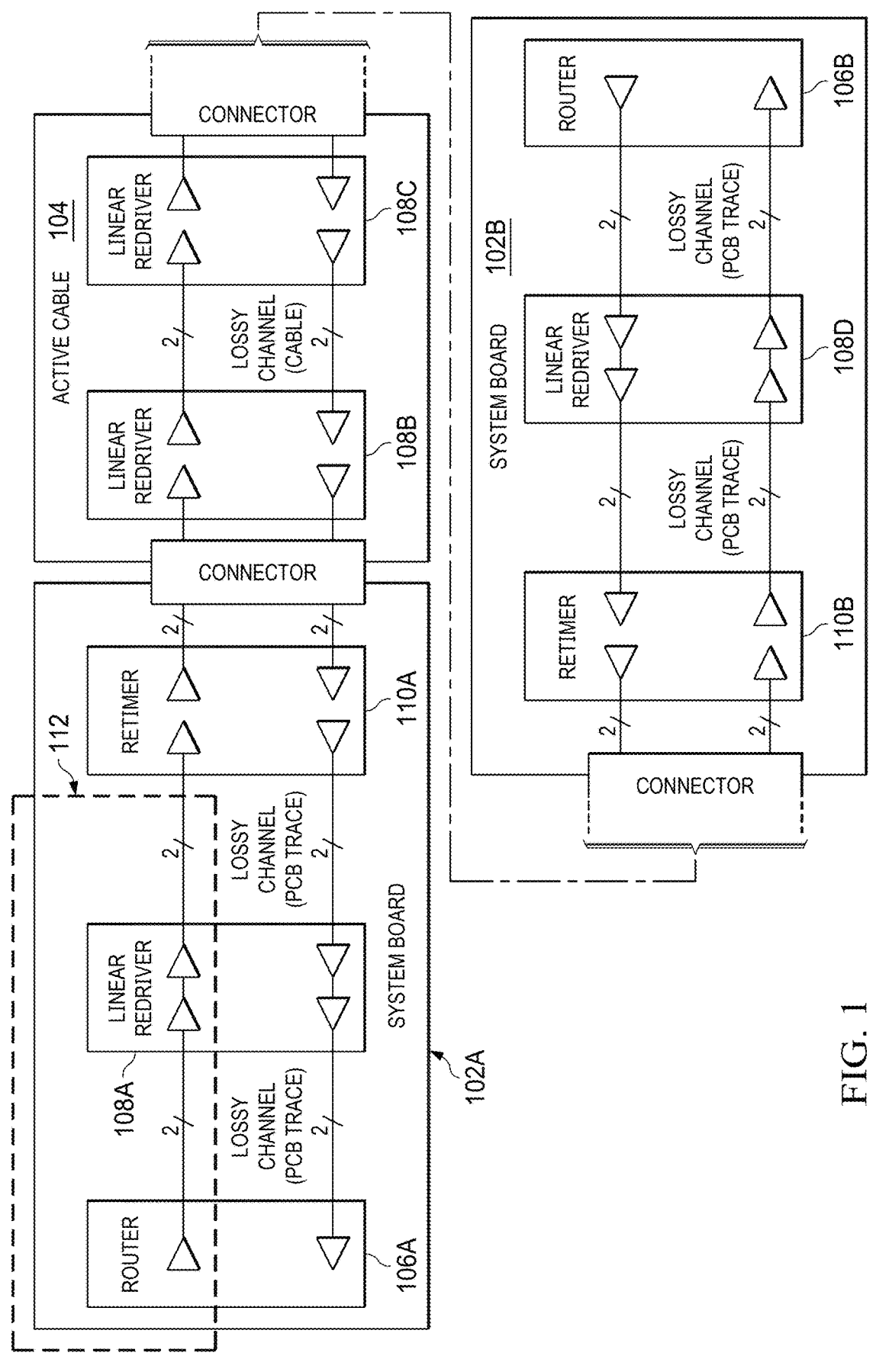
FIG. 1 is a block diagram of an example environment that include linear redriver circuits.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

To counteract frequency dependent signal attenuation, manufacturers may include redriver circuitry in one or more positions before, during, and after transmission over a medium. In general, redriver circuitry obtains and re-transmits signals such that the magnitude of high frequency components within the output signal is greater than the magnitude of high frequency components within the input signal. Although the output signal is attenuated by the transmission medium, the larger magnitude producer by the driver circuitry allows the next circuit (e.g., another redriver circuit or a destination device) to still obtain the signal and interpret the underlying information.

A variety of architecture may be used to implement redriver circuits. Examples described herein refer to linear redriver circuits. To perform accurately, linear redriver circuits are expected to stay in a linear range of operations. Linear range operations refer to operations in which the input voltage swing of the redriver circuitry is linearly proportional to the output voltage swing and is described further in connection with FIG. 3. If the relationship between the input voltage swing and output voltage swing becomes nonlinear, the redriver circuitry begins to inadvertently distort the signal such that the underlying information may become changed, inaccurate, or unrecoverable entirely.

To prevent inadvertent signal distortion, redriver circuitry includes a controller device that can adjust the settings of internal components such that the redriver circuitry remains in the linear range of operations. To perform such adjustments, the controller device requires information requires a measurement of the output voltage swing. As used above and herein, output voltage swing refers to the difference in magnitude between a maximum voltage and a minimum voltage of a differential output signal. In some examples, the difference is referred to as the envelope of the differential signal. Similarly, output voltage swing refers to the difference in magnitude between a maximum and a minimum voltage of an output signal. In examples described herein, information is transmitted using differential signals and therefore includes positive and negative portions.

Other redriver controller devices determine the output voltage swing by using a rectifier and low pass filter to: a) compute the difference between the magnitude of the positive portion and the magnitude of the negative portion, and b) compute a rolling average of the differences over time. Previous generations of redriver circuits used PAM2 signaling, which encoded digital information using only two analog voltage levels. Accordingly, the rolling average computation performed by other redriver controller devices can support PAM2.

In new generations of redriver circuits, industry members are implementing PAM3 signaling. PAM3 signaling encodes digital information across three analog voltage levels. One such encoding causes redriver circuitry to interpret a differential signal having positive and negative portions of equal magnitude as a digital 'null' symbol. In examples described herein, a differential signal having positive and negative portions of equal magnitude may be referred to as a differential zero signal. While the differential zero signal offers PAM3 greater flexibility than PAM 2, (due to the encoding of the null symbol), its repeated usage causes a rolling average of the magnitude of the differential signal to decrease over time (e.g., the presence of zeros in a set of numbers will lower the mean of those set of numbers). As a result, the rolling average technique described above cannot support PAM3 signaling because the use of differential zero signaling means that the rolling average can no longer be used to accurately determine the output voltage swing.

Example methods, apparatus, and systems described herein implement linear redriver circuitry that remains in the linear range of operations without using the foregoing rolling average technique. Instead, the redriver circuitry described herein includes example analog high-speed comparator circuitry that compares the magnitude of the differential signal to an offset value. The redriver circuitry also includes divider circuitry that divides the output of the high-speed comparator circuitry such that it is interpretable by a digital core. Within the digital core, an example finite state machine uses the output of the divider circuitry to count how many times the magnitude of the differential signal exceeded the offset value within a measurement window. The finite state machine uses the count to implement a binary search technique to identify a new gain value and apply the gain value to an example variable gain amplifier (VGA) circuit within the redriver circuitry. When the binary search technique is complete, the finite state machine has identified a gain value that maximizes the magnitude of the output voltage swing (e.g., maximizes the envelope) while keeping the redriver circuitry within the linear range of operations.

FIG. 1 is a block diagram of an example environment that includes linear redriver circuits. FIG. 1 includes example system boards 102A and 102B and an example active cable 104. The system board 102A includes example router circuitry 106A, example linear redriver circuitry 108A, and example retimer circuitry 110A. The active cable 104 includes linear redriver circuitry 108B and 108C. The system board 102B includes retimer circuitry 110B, linear redriver circuitry 108D, and router circuitry 106B. FIG. 1 also includes an example region 112.

In the example of FIG. 1, the system boards 102 are both devices that communicate with one another via the active cable 104. Furthermore, the system boards 102 are both system level devices that may have any number of independent systems on a chip (SOCs), integrated circuits (ICs), modules, etc. coordinating with one another to achieve an overall goal. Accordingly, when a signal on the active cable travels from the system board 102A to the system board 102B, the source of said signal may be from any number of modules on the system board 102A. Furthermore, the source of the signal may be located any distance from the connector that couples the active cable to the system board 102A.

The router circuitry 106A provides physical connections between the linear redriver circuitry 108A and the various signal sources within the system board 102A. The router circuitry 106A also provides physical connections and the between the linear redriver circuitry 108A and the various signal sinks within the system board 102A. As used above and herein, a signal sink refers to a module, IC, SoC, etc. that utilizes a signal for its primary purpose (e.g., to perform operations other than recovering the signal or retransmitting the signal to another component). The router circuitry 106A may include a network formed of vias, interconnects, traces, wires, and any other medium used to transmit an electrical signal. Similarly, the router circuitry 106B provides physical connections between the linear redriver circuitry 108D and the various signal sinks and sources of the system board 102B.

The linear redriver circuitry 108A, 108B, 108C, and 108D (collectively referred to as linear redriver circuits 108) each capture a signal and re-transmit the signal to counteract previous signal attenuation. For example, the linear redriver circuitry 108A counteracts signal attenuation between the circuit and the various signal sources and sinks of the system board 102A, the linear redriver circuitry 108C counteracts signal attenuation that occurs over the length of the active cable 104, etc. The linear redriver circuits 108 attempt to counteract the frequency dependent signal attenuation by transmitting an outgoing signal that has a magnitude response that increases with frequency to restore the signal sent from the transmitter.

While the description below refers to linear redriver circuitry 108A, the teachings described herein can be applied to any of the linear redriver circuits 108. More generally, the teachings described herein can apply to any linear redriver circuit without regard to where the circuit is used within a communication system. In some examples, the linear redriver circuitry 108A is referred to as a redriver device.

While the linear redriver circuits 108 are necessary to increase the amplitude of a signal, the redriver circuits also inadvertently increase internal noise that has developed within the signal. As a result, the output of the linear redriver circuits 108 can exhibit some errors such as Intersymbol Interference (ISI) and jitter.

The retimer circuitry 110A and retimer circuitry 110B (collectively referred to as retimer circuits 110) obtains an input signal, extracts the embedded clock data, fully recover underlying data within the signal, and retransmit a fresh copy of the data using a clean clock signal. In doing so, the retimer circuits 110 corrects timing errors that may have occurred during any previous portion of the signal transmission.

In the example of FIG. 1, the system board 102A and system board 102B support full duplex communication in which a given board can simultaneously transmit data to, and receive data from, the other board. As a result, the router circuits 106, linear redriver circuits 108, and the retimer circuits 110 all include transmitter and receiver circuits to support two separate communication channels within the active cable 104. In other examples, the system board 102A and system board 102B communicate in only one direction at a time.

In the example of FIG. 1, the various signal sources and sinks in the systems board 102A and system board 102B communicate using differential signaling. As a result, a given transmitter circuit or receiver circuit includes two terminals: one to send or receive a positive portion of the differential signal, and one to send or receive a negative portion of the differential signal. In other examples, the components within the example environment of FIG. 1 use signal-ended signaling.

Figure 2:
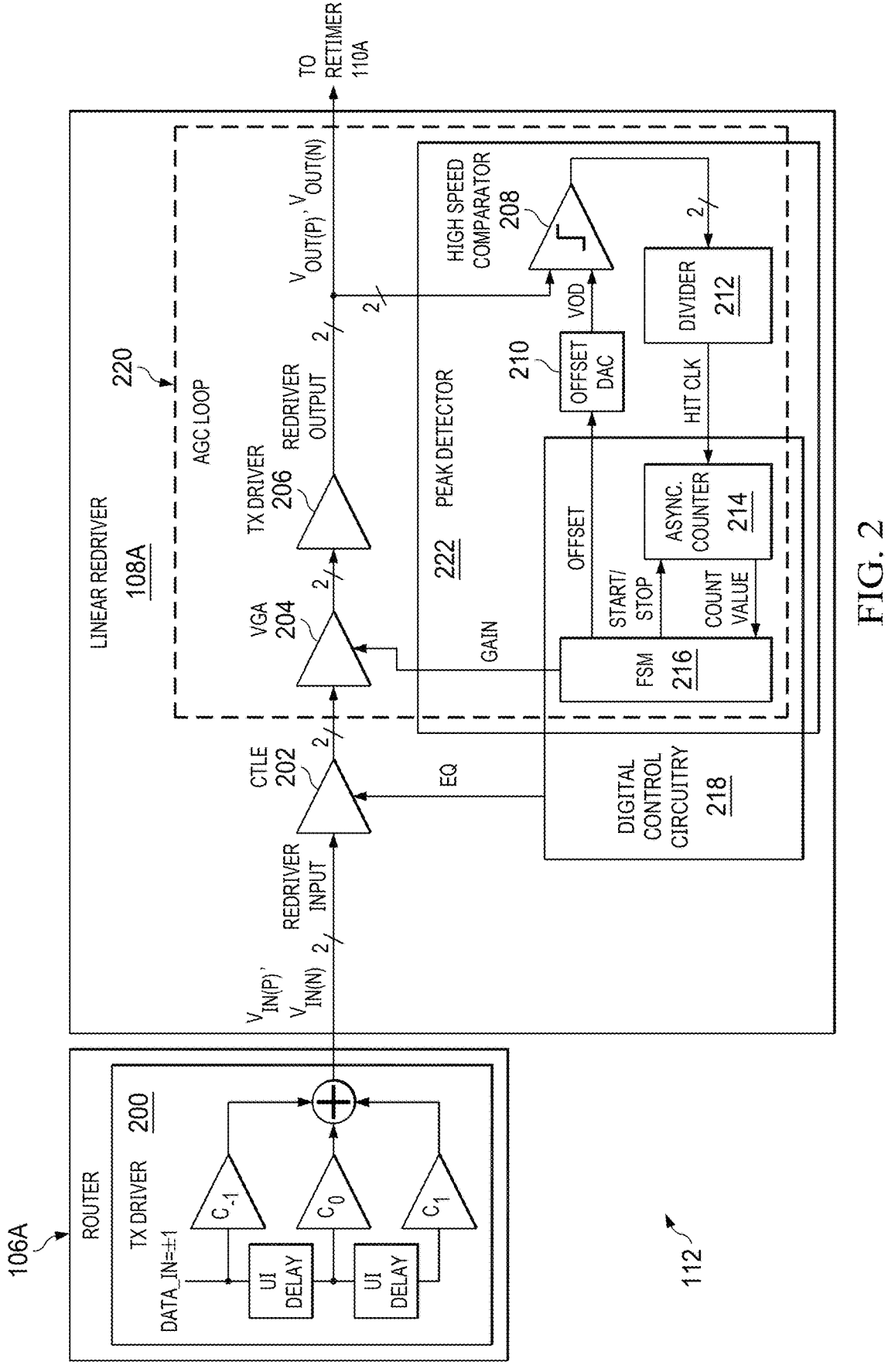
FIG. 2 is a block diagram of an example implementation of the redriver circuitry of FIG. 1.

FIG. 2 is a block diagram of an example implementation of the region 112 of FIG. 1. Accordingly, FIG. 2 is a block diagram showing a portion of the router circuitry 106A and a portion of the linear redriver circuitry 108A. The circuit components in FIG. 2 include the portions that transmit signals from the various signal sources of the system board 102A to the retimer circuitry 110A. FIG. 2 shows that the router circuitry 106A includes example transmitter driver (TX driver) circuitry 200. FIG. 2 also shows that the linear redriver circuitry 108A includes example Continuous Time Linear Equalization (CTLE) circuitry 202, example Variable Gain Amplifier (VGA) circuitry 204, example transmitter driver (TX driver) circuitry 206, example high-speed comparator (HSC) circuitry 208, example offset Digital to Analog Converter (DAC) circuitry, example divider circuitry 212, and a digital control circuitry 218. The digital control circuitry 218 implements example asynchronous counter circuitry 214 and an example Finite State Machine (FSM) 216. In examples herein, the asynchronous counter circuitry 214, the FSM 216, the HSC circuitry 208, the offset DAC circuitry 210, and the divider circuitry 212 may be collectively referred to as peak detector circuitry 222. Furthermore, the VGA circuitry 204, TX driver circuitry 206, and peak detector circuitry 222 may be collectively referred to herein as an Automatic Gain Control (AGC) Loop 220.

Within the router circuitry 106A, the TX driver circuitry 200 performs TX Feed Forward Equalization (FFE) operations. In general, TX FFE refers to the pre-distortion or shaping of data over a length of time in order to invert channel loss and distortion. For example, the TX driver circuitry 200 may perform TX FFE by de-emphasizing low frequency components within a symbol to reduce the energy of that symbol's transmission spreading across time (e.g., to flatten the channel response). In the example of FIG. 2, the TX driver circuitry 200 supports TX FFE operations by implementing a Finite Impulse Response (FIR) filter that includes various unit time delay components and constants c. In other examples, the TX driver circuitry 200 supports TX FFE operations by implementing a different architecture.

Within the linear redriver circuitry 108, the CTLE circuitry 202 equalizes the input signal it receives from the router circuitry 106A. To equalize the signal, the CTLE circuitry 202 applies a linear filter that attenuates low-frequency signal components, amplifies components up to the Nyquist frequency, and reduces the magnitude of higher frequencies. The CTLE circuitry 202 performs operations responsive to an equalization (EQ) parameter that is set by the digital control circuitry 218. The CTLE circuitry 202 is described further in connection with FIGS. 4A and 4B. In some examples, the CTLE circuitry 202 may be referred to as equalizer circuitry.

The CTLE circuitry 202 includes an output terminal that is coupled to an input terminal of the VGA circuitry 204. The VGA circuitry 204 produces amplifies the signal it receives by CTLE circuitry 202 by increasing the amplitude of the signal. The ratio between the signal amplitude at the output of the VGA circuitry 204 and the signal amplitude at the input of the VGA circuitry 204 is referred to as the gain of the VGA circuitry 204. Notably, the VGA circuitry 204 can amplify signals at any gain within a range of continuous values that the component is rated to support. In the example of FIG. 2, the specific gain value used by the VGA circuitry 204 is selected by an external component via a control terminal within the VGA circuitry 204.

In examples described herein, the VGA circuitry 204 is implemented with a resistively degenerated differential pair architecture. In such an architecture, degeneration increases at low gain settings so that the redriver circuitry 108A remains operable at higher output voltage swings. In other examples, the VGA circuitry 204 is implemented using a different architecture.

The VGA circuitry 204 includes an output terminal that is coupled to an input terminal of the TX driver circuitry 206. The TX driver circuitry 206 retransmits the signal it receives from the VGA circuitry. The output of the TX driver circuitry 206 is coupled to the retimer circuitry 110A. Accordingly, the voltage at the two output terminals of the TX driver circuitry 206 are labelled as $V_{OUT(P)}$ and $V_{OUT(N)}$ to indicate the positive and negative portions of the differential output voltage.

The output of the TX driver circuitry 206 is also coupled to the input terminal of the HSC circuitry 208. The HSC circuitry 208 determines the magnitude of the differential signal by computing $(V_{OUT(P)}-V_{OUT(N)})$. The HSC circuitry 208 then compares the magnitude to $V_{OD}$, which is the voltage output from the Offset DAC circuitry 210. As such, the output of the HSC circuitry 208 is an analog voltage that can describe whether $(V_{OUT(P)}-V_{OUT(N)})>V_{OD}$ or whether $(V_{OUT(P)}-V_{OUT(N)})<-V_{OD}$. The HSC circuitry 208 is described further in connection with FIGS. 5A and 5B.

The digital control circuitry 218 of FIG. 2 may be instantiated (e.g., creating an instance of, bring into being for any length of time, materialize, implement, etc.) by programmable circuitry such as a Central Processor Unit (CPU) executing first instructions. Also or alternatively, digital control circuitry 218 of FIG. 2 may be instantiated (e.g., creating an instance of, bring into being for any length of time, materialize, implement, etc.) by (i) an Application Specific Integrated Circuit (ASIC) or (ii) a Field Programmable Gate Array (FPGA) structured in response to execution of second instructions to perform operations corresponding to the first instructions. Some or all of the circuitry of FIG. 2 may, thus, be instantiated at the same or different times. Some or all of the circuitry of FIG. 2 may be instantiated, for example, in one or more threads executing concurrently on hardware or in series on hardware. Moreover, in some examples, some or all of the circuitry of FIG. 2 may be implemented by microprocessor circuitry executing instructions or FPGA circuitry performing operations to implement one or more virtual machines or containers.

The HSC circuitry 208 is an analog component that can change voltages at a high rate of speed. In some examples, the changes occur at approximately 25.8 Gigabaud (at 25.8e+9 changes to the signal per second). As a result, the HSC circuitry 208 can support the high rate of speed at which the system board 102A transmits data to the system board 102B. The digital control circuitry 218, however, performs operations at a relatively slow rate (e.g., one digital controller that may be implemented in the context of FIG. 2 has a clock speed of approximately 625e+6 operations per second). As such, the divider circuitry 212 retransmits the information it receives from the HSC circuitry 208 at a slower rate that is interpretable by the digital control circuitry 218. In the example of FIG. 2, the interpretable signal is labelled as a hit clock because: a) its format is similar to that of a clock signal, and b) it indicates hits, which as used above and herein refer to instances where $(V_{OUT(P)} - V_{OUT(N)}) > V_{OD}$.

The divider circuitry 212 (an analog component) has an output terminal coupled to the asynchronous counter circuitry 214 within the digital control circuitry 218. The asynchronous counter circuitry 214 observes the hit clock signal during a pre-defined measurement window to produce a count value. The count value indicates how many times the magnitude of the differential signal exceeded $V_{OD}$ during the measurement window. The asynchronous counter circuitry 214 enforces the measurement window by starting and stopping changes to the counter value responsive to instructions provided by the FSM 216. In some examples, the asynchronous counter circuitry 214 is instantiated by programmable circuitry executing asynchronous counter instructions to perform operations such as those represented by the flowchart(s) of FIGS. 10 and 11.

The offset DAC circuitry 210 provides $V_{OD}$ to the HSC circuitry 208 responsive to instructions from the FSM 216. In the examples described herein, the instructions from the FSM 216 are static in that $V_{OD}$ does not change. Rather, the value of $V_{OD}$ represents a target output voltage magnitude as described further in connection with FIG. 3. In other examples, the voltage provided to the HSC circuitry 208 for comparison against the magnitude of $V_{OUT}$ does change.

The FSM 216 includes input and output terminals coupled to the asynchronous counter circuitry 214. The terminals enable the FSM 216 to provide timing instructions and to obtain the count value as described above. The FSM 216 also includes an output terminal coupled to the control terminal of the VGA circuitry 204. As such, the FSM 216 can select which gain the VGA circuitry 204 operates at. After selecting a gain value, the FSM 216 initiates a measurement window with the asynchronous counter circuitry 214 and waits for the other components of the peak detector circuitry 222 to perform operations and produce an updated count value. The updated count value quantifies how close the FSM 216 is to obtaining the goal of the linear redriver circuitry 108A: the highest possible the output voltage swing that is still linearly related to the input voltage swing. In examples described herein, the gain value that enables such performance may be referred to as an optimal gain value or a desired gain value. While a linear relationship between output voltage swing and input voltage swing is necessary to maintain signal integrity and prevent data corruption or data loss, a large output voltage swing is desirable because a high magnitude signal improves the Signal to Noise and Distortion Ratio (SNDR) of the signal, thereby helping to maintain the accuracy of the data despite the signal attenuation that occurs throughout the transmission medium. The optimal gain value is described further in connection with FIG. 3. In some examples, the FSM 216 is instantiated by programmable circuitry executing FSM instructions to perform operations such as those represented by the flowchart(s) of FIGS. 10 and 11.

If the count value indicates the output voltage swing can be further increased while still remaining in a linear mode of operations, the FSM 216 selects a larger gain value to test on the VGA circuitry 204 during the next measurement window. Conversely, if the count value indicates the linear redriver circuitry 108A is operating in a non-linear mode, the FSM 216 selects a smaller gain value to test on the VGA circuitry 204. To minimize the amount of time required to identify the optimal gain value, the FSM 216 uses a binary search technique to determine which gain value (within a range of possible gain values) will be tested next in view of the existing information. As such, the VGA circuitry 204, TX driver circuitry 206, and peak detector circuitry 222 are collectively referred to as the AGC loop 220 because the components perform iterative operations: the VGA circuitry operates at a certain gain value, the HSC circuitry 208 quickly and accurately determines whether $(V_{OUT(P)} - V_{OUT(N)}) > V_{OD}$, the FSM 216 uses a count value that is responsive to the output of the HSC circuitry 208 to select a new gain value, and the loop repeats. Because the AGC loop 220 enables the linear redriver circuitry 108A to maximize performance while: a) remaining in the linear range of operations, and b) not computing a rolling average of $(V_{OUT(P)} - V_{OUT(N)}) > V_{OD}$, the AGC loop 220 can support $V_{IN}$ signals that are formatted using the PAM3 protocol. Accordingly, linear redriver circuits that implement the AGC loop 220 as described herein can support a wider variety of inputs and use cases than other linear redriver circuits.

Figure 3:
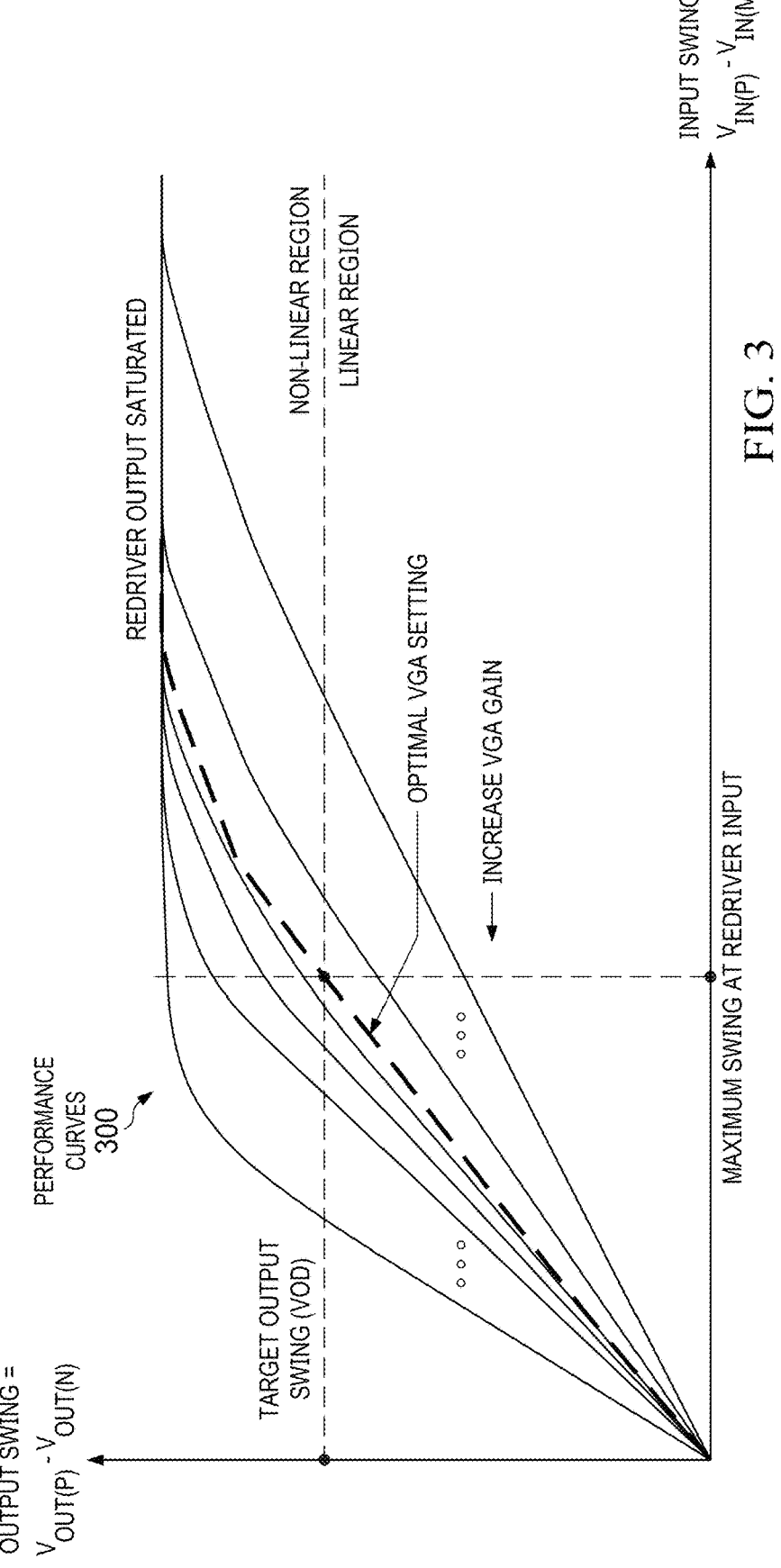
FIG. 3 is an example graph illustrating the relationship between gain and voltage swing in the redriver circuitry of FIG. 1.

FIG. 3 is an example graph illustrating the relationship between gain and voltage swing in the redriver circuitry of FIG. 1. FIG. 3 includes a graph with input voltage swing $(V_{IN(P)} - V_{IN(N)})$ on the x axis and output voltage swing $(V_{OUT(P)} - V_{OUT(N)})$ on the y axis.

The graph of FIG. 3 plots multiple performance curves 300. A single performance curve describes the performance of the linear redriver circuitry 108A when the VGA circuitry 204 operates at a particular gain value. Because gain refers to the ratio of output voltage swing to input voltage swing, the performance curves on the left of the graph of FIG. 3 correspond to a larger gain value than the performance curves on the right of the graph.

The performance curves 300 show that, when the input voltage swing is sufficiently small, the output swing is linearly proportional to the input voltage swing regardless of the gain value. This type of functionality is marked as the linear region of FIG. 3 and is referred to herein as a linear mode of operation.

As the input voltage swing increases, the output of the linear redriver circuitry 108A saturates. During saturation, all of the performance curves, regardless of gain or input voltage swing, approach a single value (e.g., the maximum offset voltage swing). A redriver circuit that operates in such conditions may cause errors that lead to the loss or corruption of information.

To prevent such errors, the linear redriver circuitry 108A labels a specific output voltage swing as the target output swing. The target output swing represents the value between the linear region and the non-linear region. If the output voltage swing is less than the target output swing, it is linearly proportional to the input voltage swing and the redriver circuitry 108A is operating accurately. Conversely, if the output voltage swing is greater than the target output swing, the redriver circuitry 108A is a nonlinear mode of operation that may cause errors. To enforce this linearity boundary, the manufacturers implement the FSM 216 and offset DAC circuitry 210 such that $V_{OD}$ is equal to the target output swing value.

The manufacturers of the linear redriver circuitry 108A also selects and publishes (e.g., prints on data sheets) a maximum input voltage swing. The maximum input voltage swing represents a voltage at which, if the customer keeps the value of $(V_{IN(P)}-V_{IN(N)})$ equal or less than to, the manufacturer promises that the linear redriver circuitry 108A will produce a value of $(V_{OUT(P)}-V_{OUT(N)})$ that is linearly proportional. If instead the customer provides a value of $(V_{IN(P)}-V_{IN(N)})$ that is greater than the maximum input voltage swing, the customer has exceeded the rating of the linear redriver circuitry 108A. In such examples, the linear redriver circuitry 108A may operate in a nonlinear mode and produce an inaccurate $V_{OUT}$ signal. To determine the maximum input voltage swing, the manufacturers may identify the largest x coordinate on the graph of FIG. 3 at which a threshold number of the performance curves 300 is still in a linear mode.

Figure 7:
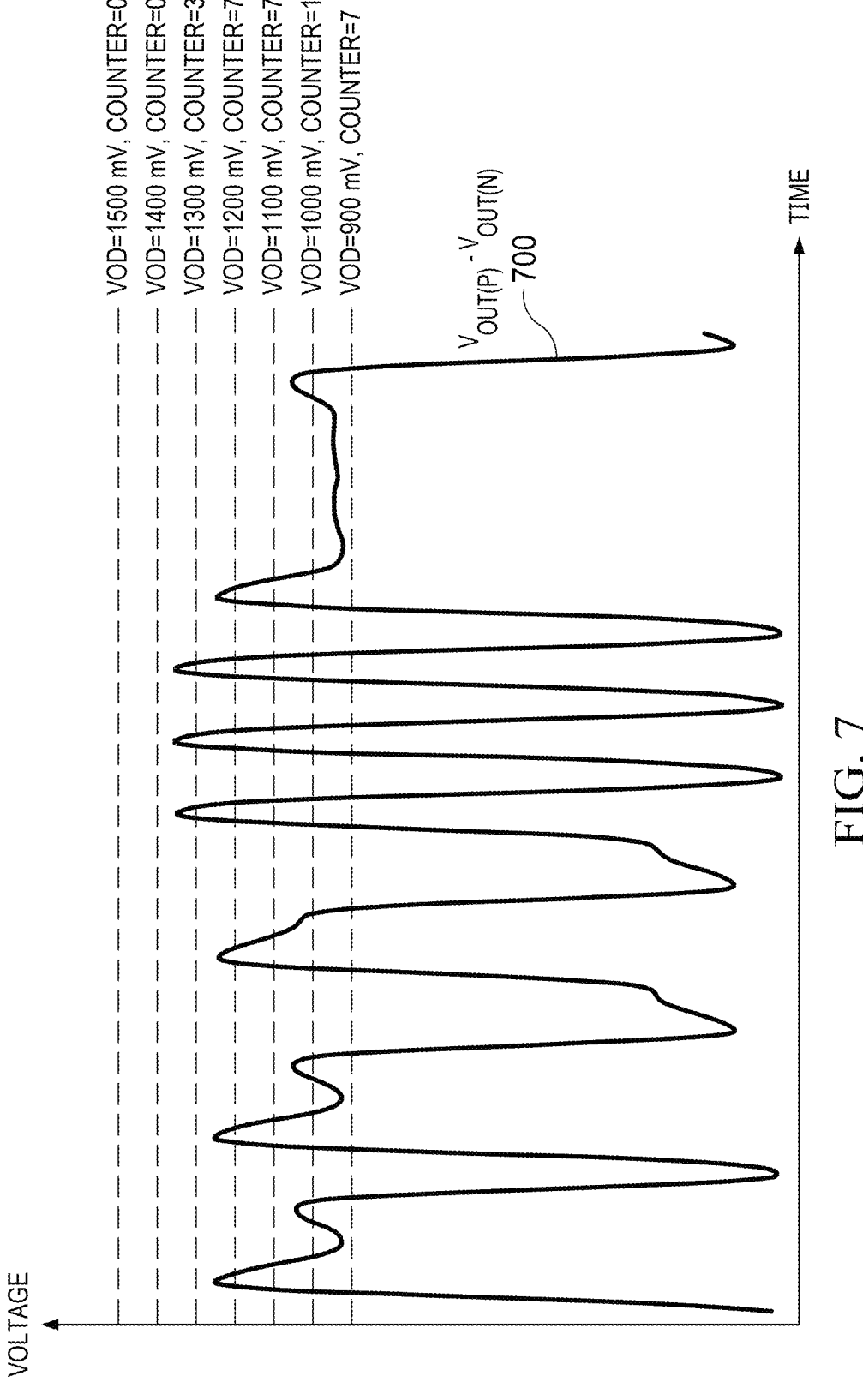
FIG. 7 is a graph illustrating an example performance of the Finite State Machine (FSM) circuitry of FIG. 2.

To find the optimal gain value described above, the FSM 216 identifies the particular performance curve that is closest to the <x, y> coordinate of: <input voltage swing, target output swing>. In doing so, the FSM 216 finds the gain value that has the largest possible output voltage swing while still being in the linear region. In the example of FIG. 7, the AGC loop 220 finds the optimal gain value based on the input voltage swing being set at the maximum value. In other examples where the input voltage is less than the maximum value, the AGC loop 220 finds an optimal gain value that is lower than the one shown in FIG. 7. More generally, the AGC loop 220 finds, responsive to the input voltage swing, an optimal gain value that: a) ensures $V_{OUT}$ remains approximately equal to $V_{OD}$ while b) keeping the device in linear mode.

The VGA circuitry 204 may support any number of discrete gain values, or an infinite number of continuous gain values, within a certain range. Accordingly, the number of performance curves 300 may be infinitely many. To identify the specific performance curve (e.g., the specific gain value) that brings the linear redriver circuitry 108A closest to the intersection of <maximum input voltage swing, target output swing>, the FSM 216 implements a binary search technique. The binary search technique is described further in connection with FIG. 11.

Figure 4A:
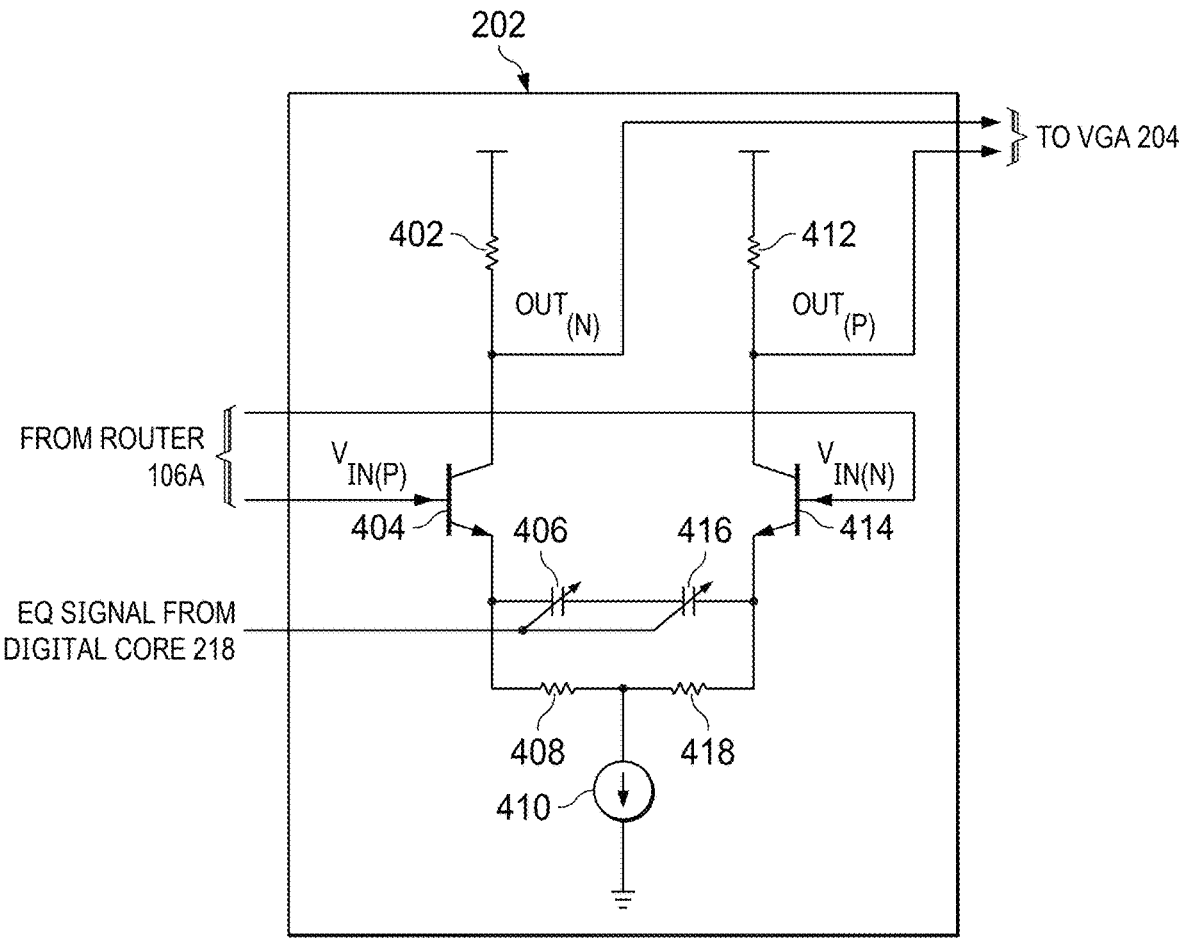
FIG. 4A is a schematic diagram of an example implementation of the continuous time linear equalization (CTLE) circuitry of FIG. 2.

FIG. 4A is a schematic diagram of an example implementation of the CTLE circuitry 202 of FIG. 2. The CTLE circuitry 202 includes example resistors 402, 408, 412, and 418, example transistors 404 and 414, example variable capacitors 406 and 416, and an example current source 410.

Within the CTLE circuitry 202, the resistor 402 includes a first terminal that can receive a supply voltage and a second terminal. The voltage at the second terminal of the resistor 402 is the negative portion of the output signal provided to the VGA circuitry 204.

The transistor 404 includes a first current terminal coupled to the second terminal of the resistor 402, a control terminal that receives the $V_{IN(P)}$ signal from the router circuitry 106A, and a second current terminal. When the voltage at the $V_{IN(P)}$ signal exceeds a threshold, the transistor 404 functions as a closed switch and allows current to flow from the first current terminal to the second current terminal.

The variable capacitor 406 has a positive terminal coupled to the second current terminal of the transistor 404, a control terminal, and a negative terminal. The variable capacitor 406 changes capacitance values responsive to the EQ signal received from the digital control circuitry 218.

The resistor 408 includes a first terminal coupled to the second current terminal of the transistor 404 and to the positive terminal of the variable capacitor 406. The resistor 408 also includes a second terminal coupled to the current source 410. The current source 410 includes a first terminal coupled to the resistor 408 and a second terminal coupled to ground.

The resistor 412 includes a first terminal that can receive a supply voltage and a second terminal. The voltage at the second terminal of the resistor 412 is the positive portion of the output signal provided to the VGA circuitry 204.

The transistor 414 includes a first current terminal coupled to the second terminal of the resistor 412, a control terminal that receives the $V_{IN(N)}$ signal from the router circuitry 106A, and a second current terminal. When the voltage at the $V_{IN(N)}$ signal exceeds a threshold, the transistor 414 functions as a closed switch and allows current to flow from the first current terminal to the second current terminal.

The variable capacitor 416 has a negative terminal coupled to the second current terminal of the transistor 414, a control terminal, and a positive terminal coupled to the negative terminal of the variable capacitor 406. The variable capacitor 416 changes capacitance values responsive to the EQ signal received from the digital control circuitry 218. In other examples, the polarity of the capacitors 406 or 416 may be different.

The resistor 418 includes a first terminal coupled to the second current terminal of the transistor 414 and to the negative terminal of the variable capacitor 416. The resistor 418 also includes a second terminal coupled to the resistor 408 and to the current source 410.

In the example of FIG. 4A, the transistors 404 and 414 are p-channel MOSFETs. Alternatively, the transistors 404 and 414 may be p-channel FETs, p-channel IGBTs, p-channel JFETs, PNP BJTs, or, with slight modifications, N-type equivalent devices. The transistors 404 and 414 may be depletion mode devices, drain-extended devices, enhancement mode devices, natural transistors or other type of device structure transistors. Furthermore, the transistors 404 and 414 may be implemented in/over a silicon substrate (Si), a silicon carbide substrate (SIC), a gallium nitride substrate (GaN) or a gallium arsenide substrate (GaAs).

Figure 4B:
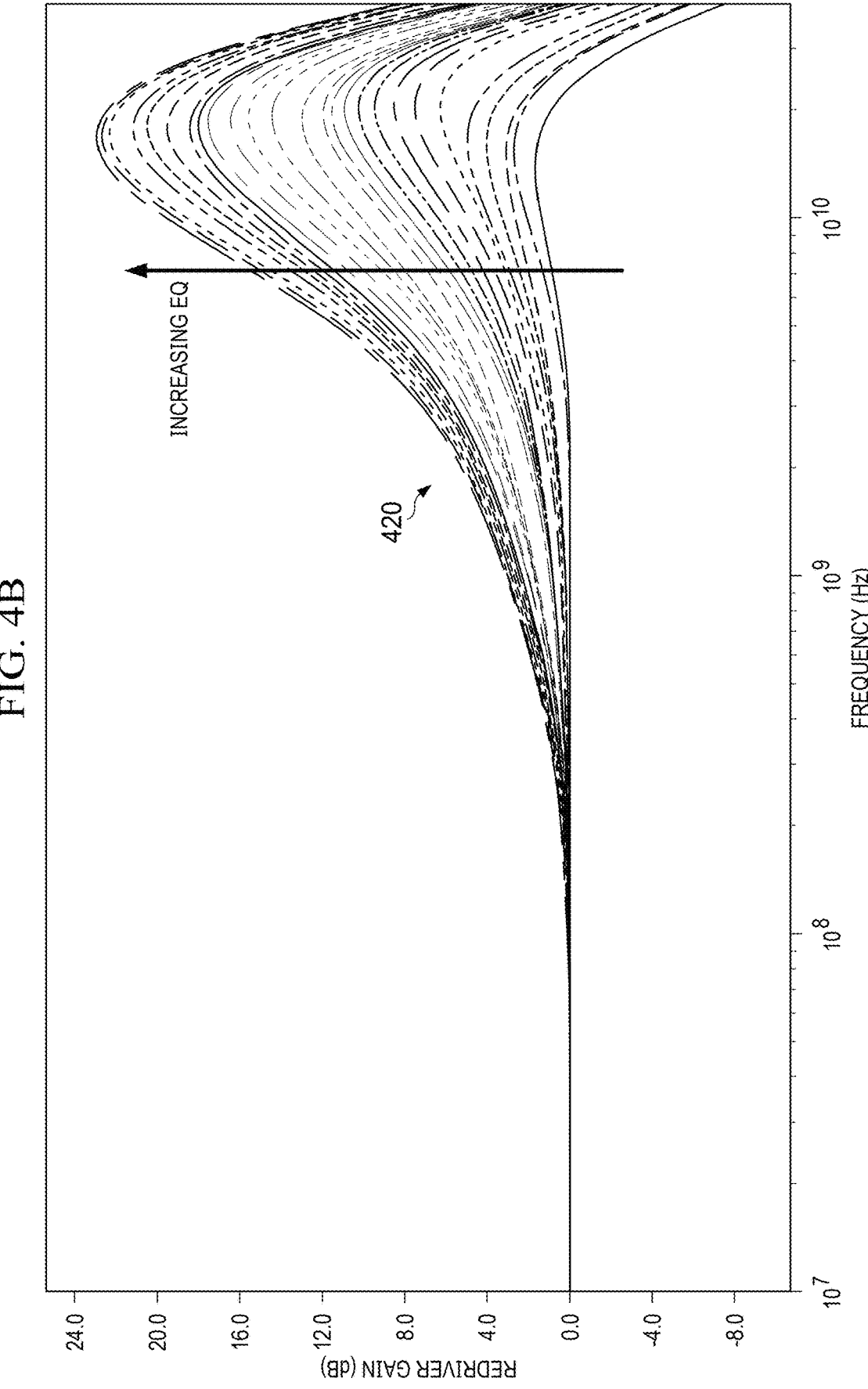
FIG. 4B is a graph illustrating an example performance of the CTLE circuitry of FIG. 2.

FIG. 4B is a graph illustrating an example performance of the CTLE circuitry of FIG. 2. FIG. 4B includes a graph with frequency on the x axis measured in Hertz (Hz). The graph also includes redriver gain on the y axis measured in decibels (dB). The graph of FIG. 4B plots a plurality of performance curves 420.

The performance curves 420 show that the CTLE circuitry 202 dampens low frequency components of incoming signals by setting the redriver gain to be at or near 0 dB. The CTLE circuitry 202 also amplifies frequency components around the Nyquist frequency (which is approximately 10e10 Hz in the example of FIG. 4B) by increasing the redriver gain until. The CTLE circuitry 202 also reduces the magnitude of higher frequencies (e.g., those above 10e10 Hz in the example of FIG. 4B) by applying a negative redriver gain.

While all of the performance curves 420 follow the general behavior described above, the digital control circuitry 218 causes the CTLE circuitry 202 to move between performance curves 420 and select specific gain values at specific frequencies by changing the EQ setting. In particular, increasing the EQ setting causes the capacitance of the variable capacitors 406 and 416 to change such that the CTLE circuitry 202 implements a larger redriver gain. The operations performed by the digital control circuitry 218 to find an optimal EQ setting may be referred to as Adaptive Equalization (AEQ). The digital control circuitry 218 may use any suitable equalization technique to perform AEQ operations.

Figure 5A:
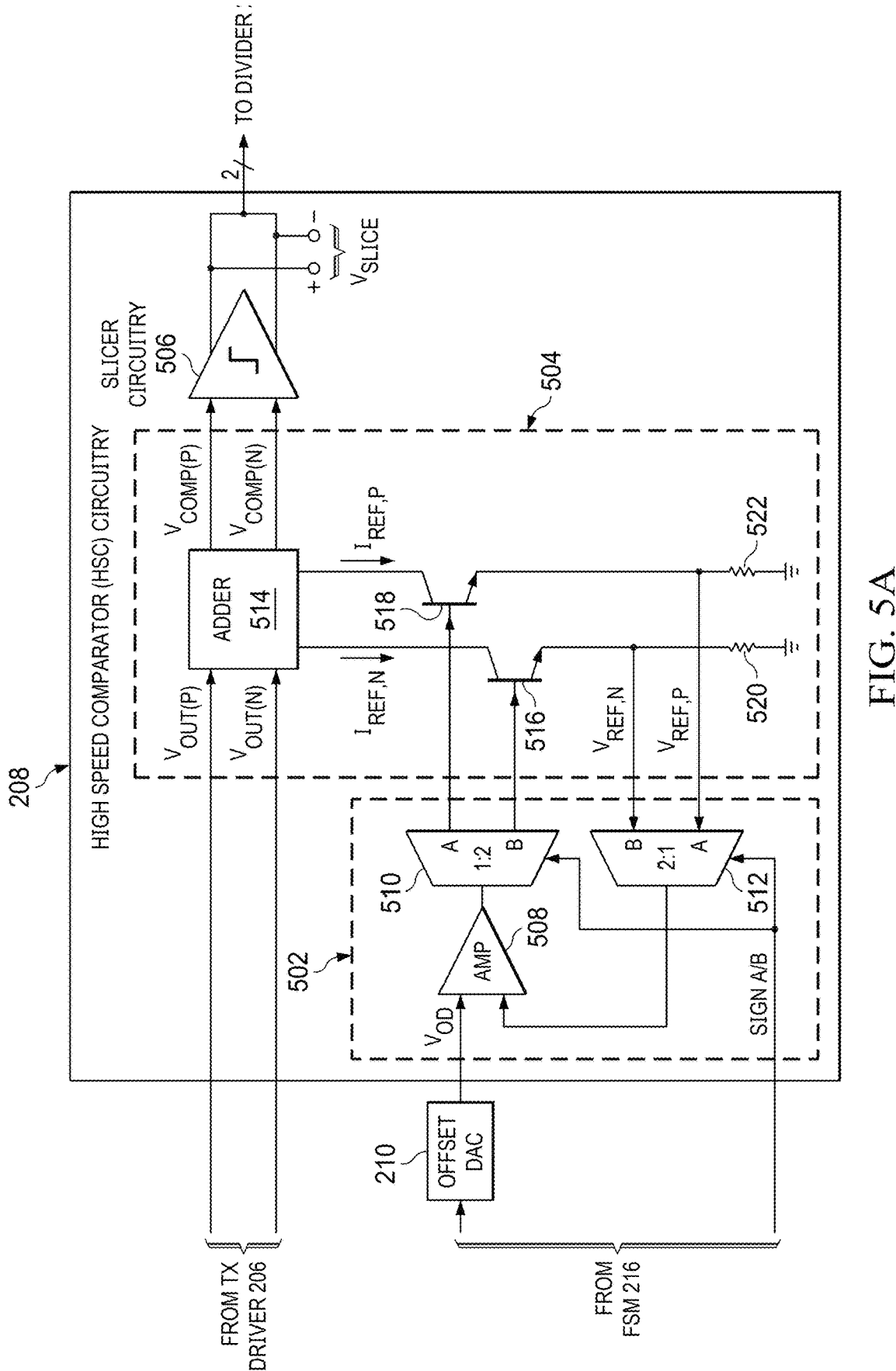
FIG. 5A is a schematic diagram of an example implementation of the high-speed comparator (HSC) circuitry of FIG. 2.

FIG. 5A is a schematic diagram of an example implementation of the high-speed comparator (HSC) circuitry of FIG. 2. FIG. 5A shows the HSC circuitry 208 and the offset DAC circuitry 210. The HSC circuitry 208 includes example voltage-to-current loop amplifier circuitry 502, example signed voltage-to-current converter circuitry 504, and example slicer circuitry 506. The voltage-to-current loop amplifier circuitry 502 includes example amplifier circuitry 508 and example multiplexer circuitry (which may be referred to herein as MUXes) 510 and 512. The signed voltage-to-current converter circuitry 504 includes example adder circuitry 514 and example transistors 516 and 518.

Within the voltage-to-current loop amplifier circuitry 502, the amplifier circuitry 508 has a first input terminal coupled to the offset DAC circuitry 210 and a second input terminal coupled to an output terminal of the mux 512. The amplifier circuitry 508 produces an output voltage that is equal to the difference of voltages at its input terminals multiplied by an amplification constant.

The mux 510 has an input terminal coupled to an output terminal of the amplifier circuitry 508 and a selection terminal that receives a SIGN signal from the FSM 216. The mux 510 also includes a first output terminal that is coupled to a control terminal of the transistor 518 and a second output terminal that is coupled to a control terminal of the transistor 516.

The mux 512 includes a first input terminal that is coupled to a second current terminal of the transistor 516 and a second input terminal that is coupled to a second current terminal of the transistor 518. The mux 512 also includes a selection terminal that receives the SIGN signal from the FSM 216 and an output terminal coupled to the amplifier circuitry 508.

Within the signed voltage-to-current converter circuitry 504, the adder circuitry 514 includes a first input terminal that receives $V_{OUT(P)}$ from the TX driver circuitry 206 and a second input terminal that receives $V_{OUT(N)}$ from the TX driver circuitry 206. The adder circuitry 514 also includes a first output terminal that transmits a negative portion of a reference current signal (labeled in FIG. 5A as $I_{REF(N)}$) and a second output terminal that transmits a positive portion of the reference current signal ($I_{REF(P)}$). The adder circuitry 514 also includes a third output terminal that transmits a positive portion of a comparison signal ($V_{COMP(P)}$) and a fourth output terminal that transmits the negative portion of the comparison signal ($V_{COMP(N)}$).

The transistor 516 includes a first current terminal coupled to the adder circuitry 514 that receives $I_{REF(N)}$, a control terminal coupled to the second output terminal of the mux 510, and a second current terminal coupled to the first input terminal of the mux 512. The voltage produced at the second current terminal of the transistor 516 is the negative portion of a reference voltage signal ($V_{REF(N)}$). When the voltage at its control terminal exceeds a threshold, the transistor 516 functions as a closed switch and allows $I_{REF(N)}$ to flow from the first current terminal to the second current terminal.

The transistor 518 includes a first current terminal coupled to the adder circuitry 514 that receives $I_{REF(P)}$, a control terminal coupled to the first current terminal of the mux 510, and a second current terminal coupled to the second input terminal of the mux 512. The voltage produced at the second current terminal of the transistor 516 is the negative portion of a reference voltage signal ($V_{REF(N)}$). When the voltage at its control terminal exceeds a threshold, the transistor 518 functions as a closed switch and allows $I_{REF(P)}$ to flow from the first current terminal to the second current terminal.

In the example of FIG. 5A, the transistors 516 and 518 are PNP Bipolar Junction Transistors (BJTs). Alternatively, the transistors 516 and 518 may be p-channel FETs, p-channel IGBTs, p-channel JFETs, p-channel MOSFETs, or, with slight modifications, N-type equivalent devices. The transistors 516 and 518 may be depletion mode devices, drain-extended devices, enhancement mode devices, natural transistors or other type of device structure transistors. Furthermore, the transistors 516 and 518 may be implemented in/over a silicon substrate (Si), a silicon carbide substrate (SiC), a gallium nitride substrate (GaN) or a gallium arsenide substrate (GaAs).

The resistor 520 includes a first terminal coupled to the second current terminal of the transistor 516 and a second terminal coupled to ground. The resistor 522 includes a first coupled to the second current terminal of the transistor 518 and a second terminal coupled to ground. In the example of FIG. 5A, the resistors 520 and 522 share the same resistance value.

The voltage-to-current loop amplifier circuitry 502 and the signed voltage-to-current converter circuitry 504 perform different operations responsive to the SIGN signal. In examples described herein, the FSM 216 uses the SIGN signal to select one of two options (labeled 'A' or 'B'). If the SIGN signal is set to option 'A', the mux 510 produces a voltage that causes the transistor 518 to turn ON (e.g., functions as a closed switch) and the mux 512 provides $V_{REF(P)}$ to the input of the amplifier circuitry 508. In such an example, the HSC circuitry 208 compares the local maximums of the differential signal to a positive offset value (e.g., evaluates whether $(V_{OUT(P)}-V_{OUT(N)})>V_{OD})$).

Alternatively, if the FSM 216 sets the SIGN signal to option 'B', the mux 510 produces a voltage that causes the transistor 516 to turn ON (e.g., functions as a closed switch) and the mux 512 provides $V_{REF(N)}$ to the input of the amplifier circuitry 508. In such an example, the HSC circuitry 208 compares the local minimums of the differential signal to a positive offset value (e.g., evaluates whether $(V_{OUT(P)}-V_{OUT(N)})<V_{OD})$).

The FSM 216 can use either option 'A' or option 'B' to determine the envelope of the differential output signal because, in general, the $V_{OUT}$ signal is symmetric over long periods of time such that the average magnitude of the local maximums is equal to the average magnitude of the local minimums. In some examples, the FSM 216 switches the value of the SIGN signal in-between one or more measurement windows to prevent instances of unequal local maximums and minimums from affecting the performance of the redriver circuitry 108A.

The operations of the HSC circuitry 208 also cause the values of $V_{COMP}$ to change responsive to the SIGN signal. For example, if the FSM 216 uses the SIGN signal to select option 'A', then $V_{COMP(P)}$ and $V_{COMP(N)}$ are set to the voltages provided in equations 1, and 2, respectively:

$$V_{COMP(N)} = V_{OUT(N)} \quad (1)$$

$$V_{COMP(P)} = V_{OUT(P)} - k(V_{REF(P)}) \quad (2)$$

In equation 2, k is a constant determined by $R_{INT}/R_{52X}$, where $R_{INT}$ is the internal resistance of the adder circuitry 514 and $R_{52X}$ is the resistance value shared by the resistors 520 and 522. Alternatively, if the FSM 216 uses the SIGN signal to select option 'B', then $V_{COMP(P)}$ and $V_{COMP(N)}$ are set to the voltages provided in equations 3, and 4, respectively:

$$V_{COMP(N)} = V_{OUT(N)} - k(V_{REF(N)}) \quad (3)$$

$$V_{COMP(P)} = V_{OUT(P)} \quad (4)$$

The slicer circuitry 506 produces $V_{SLICE(P)}$, an edited version of $V_{COMP(P)}$ that removes any portions of the signal that exceed the ground voltage level. The slicer circuitry 506 also produces $V_{SLICE(N)}$, an edited version of $V_{COMP(N)}$ that removes any portions of the signal that exceed the ground voltage level. When interpreted together, $V_{SLICE(P)}$ and $V_{SLICE(N)}$ collectively form a $V_{SLICE}$ signal. As described further, the slicer circuitry 506 acts as a differential comparator with a threshold of 0 V. In some examples, the slicer circuitry 506 is referred to as voltage clipper circuitry.

Linear redriver devices that compute rolling averages of the difference between $V_{OUT(P)}$ and $V_{OUT(N)}$ can also include comparator devices to perform CTLE adaptation or errors slicer operations. However, the adder circuit in such comparator devices have relatively low headroom. As a result, the adder circuit of such comparator devices can saturate and fail to perform operations properly. Advantageously, in the example of FIG. 5A, the use of the transistors 516, 518, resistors 520, 522, and the voltage-to-current loop amplifier circuitry 502 enables the adder circuitry 514 to have comparatively larger headroom and perform operations in a wider variety of use cases than other linear redriver devices. Furthermore, the comparator circuitry shown in FIG. 5A and described herein operates with a smaller supply voltage (e.g., 1.8 V) than other comparator devices in other redrivers (e.g., 2.5 V).

Figure 5B:
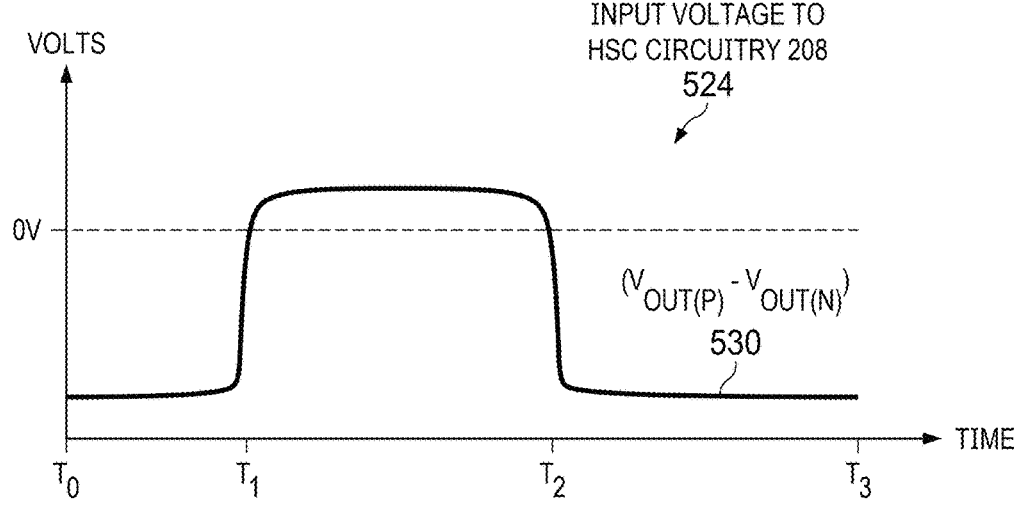
FIG. 5B are graphs illustrating an example performance of the HSC circuitry of FIG. 2.
Figure 5B:
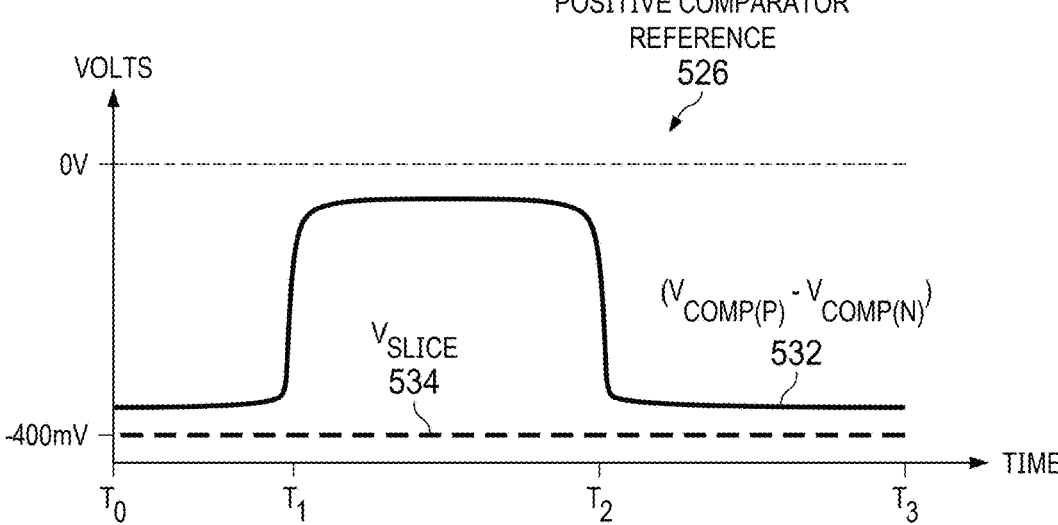
Figure 5B:
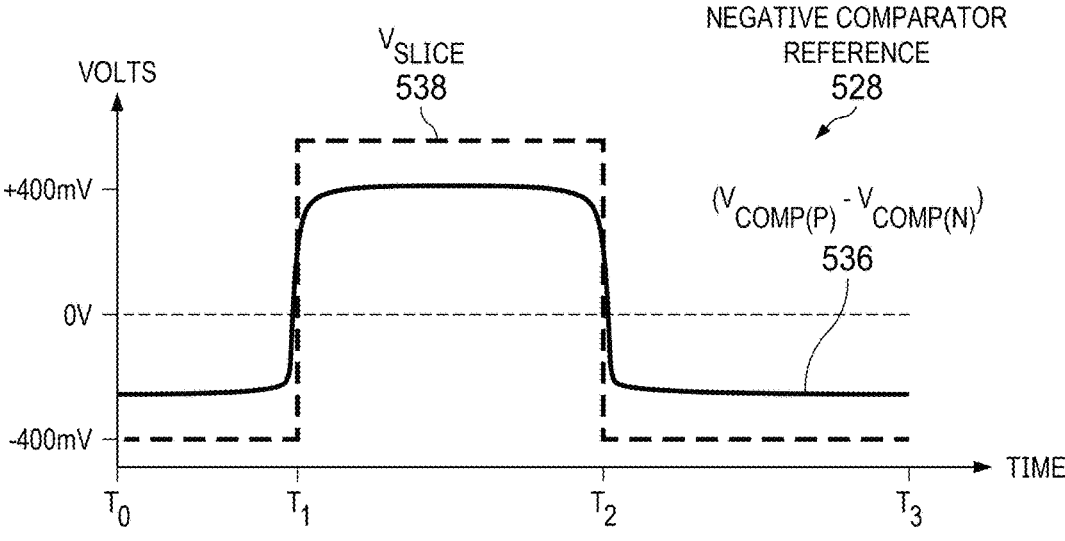

FIG. 5B are graphs illustrating an example performance of the HSC circuitry of FIG. 2. FIG. 5B includes example graphs 524, 526, and 528. Each of the graphs 524, 526, and 528 plot time on the x axis and voltage on the y axis. The x axes include timestamps T0, T1, T2, T3, and T4 that refer to the same points in time on the graphs 524, 526, and 528. The graph 524 includes an example signal 530, the graph 526 includes example signals 532 and 534, and the graph 528 includes example signals 536 and 538.

The graph 524 shows an input voltage to the HSC circuitry 208. Accordingly, the signal 530 represents the differential output voltage (e.g., the value $(V_{OUT(P)} - V_{OUT(N)})$. As shown in FIG. 2, the $V_{OUT}$ signal is both an output of the linear redriver circuitry 108A and an input to the HSC circuitry 208. The graph 524 shows that the signal is less than 0 V before T1, is greater than 0 V from T1 to T2, and is less than 0 V after T2.

The graph 526 represents an example where the signal 530 remains less than $V_{OD}$ throughout T1 to T4. The foregoing comparison influences the values of $V_{REF}$, which in turn changes the values of $V_{COMP}$. Accordingly, the signal 532, which represents the value of $(V_{COMP(P)} - V_{COMP(N)})$, is a version of the signal 530 shifted downwards such that the signal 532 remains less than 0 V throughout T1 to T4. Because the signal 532 never crosses 0 V in the graph 526, the signal 534 shows that the slicer circuitry 506 maintains $V_{SLICE}$ at a static voltage representative of a logical 0 (e.g., −400 mV in the example of FIG. 5B) throughout T1 to T4. The logical 0 in the $V_{SLICE}$ signal indicates periods when the differential output voltage (e.g., the signal 530) is less than the offset voltage ($V_{OD}$). In examples described herein, such an example is described as a positive comparator reference because $[V_{OD} - (V_{OUT(P)} - V_{OUT(N)})]$ is a positive value in the graph 526.

The graph 528 represents an example where the signal 530 is greater than $V_{OD}$ from T1 to T2 and less than $V_{OD}$ at other times. Because the value of $V_{REF}$ changes as the comparison between $V_{OD}$ and the output voltage changes, the signal 536 (which represents $(V_{COMP(P)} - V_{COMP(N)})$) becomes a version of the signal 530 shifted upwards. Accordingly, the signal 538 shows that slicer circuitry 506 keeps $V_{SLICE}$ at the logical 0 voltage when the signal 532 is below 0 V and moves $V_{SLICE}$ to a voltage representative of a logical 1 (e.g., +400 mV in the example of FIG. 5B). The logical 1 in the $V_{SLICE}$ signal indicates periods when the differential output voltage (e.g., the signal 530) is greater than the offset voltage ($V_{OD}$). In examples described herein, such an example is described as a negative comparator reference because $[V_{OD} - (V_{OUT(P)} - V_{OUT(N)})]$ is a negative value for portions of the graph 528.

Figure 6:
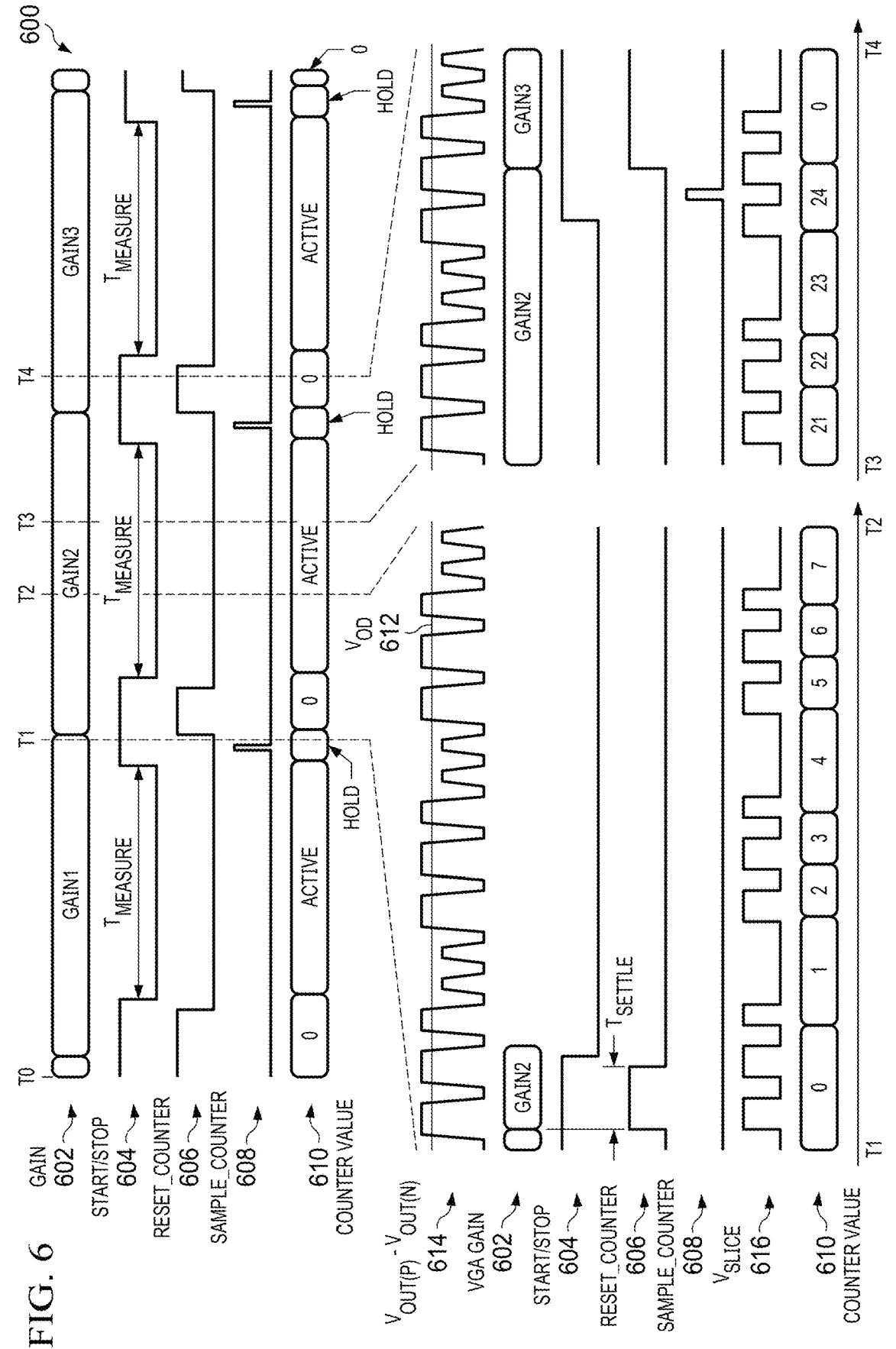
FIG. 6 is a timing diagram illustrating an example performance of the Finite State Machine (FSM) circuitry of FIG. 2.

FIG. 6 is a timing diagram illustrating an example performance of the Finite State Machine (FSM) circuitry of FIG. 2. FIG. 6 includes a main timeline 600 and example signals 602-616. The main timeline 600 includes timestamps T0, T1, T2, T3, T4 that are independent of and separate from the timestamps of FIG. 5B. FIG. 6 also includes two sub-timelines. The first sub-timeline is a zoomed in view of T1 through T2 on the main timeline 600. Similarly, the second sub-timeline is a zoomed in view of T3 through T4 on the main timeline 600.

The signal 602 represents how the FSM 216 changes the gain value used by the VGA circuitry 204 throughout the main timeline 600. The signal 602 shows the FSM 216 changes the gain from a first value to a second value shortly after T1. The FSM 216 changes the gain again to a third value between T3 and T4.

The signal 604 represents the START/STOP signal that is generated by the FSM 216 and provided to the asynchronous counter circuitry 214 as shown in FIG. 2. When the FSM 216 sets the START/STOP signal to a logical 1, the asynchronous counter circuitry 214 does not update the counter value responsive to $V_{OD}$ and the output voltage. When the FSM 216 sets the START/STOP signal to a logical 0, the asynchronous counter circuitry 214 updates the counter value responsive to $V_{OD}$ and the output voltage. Periods where the asynchronous counter circuitry 214 updated the counter value are labelled as ACTIVE within the signal 610.

The signal 604 shows three periods of equal duration, labeled $T_{MEASURE}$, where the START/STOP signal is at a logical 0 and the signal 610 is ACTIVE. In examples described above and herein, the periods of length $T_{MEASURE}$ are referred to as measurement windows.

The signal 606 represents the value of reset_counter, a parameter generated by the FSM 216 to provide instructions to the asynchronous counter circuitry 214. When the value of reset_counter is at a logical 1, the asynchronous counter circuitry 214 resets the counter value to zero. When the value of reset_counter is at a logical 0, the asynchronous counter circuitry 214 is permitted to change the counter value responsive to the START/STOP signal (e.g., signal 602).

In the example of FIG. 6, the START/STOP signal 604 transitions from a logical 0 to a logical 1 before T1, but the reset_counter signal 606 does not transition from a logical 0 to a logical 1 until after T1. As such, the timestamp T1 is within a period where the measurement window has ended but the FSM 216 has not yet reset the counter value. During such a period, the signal 610 shows that the asynchronous counter circuitry 214 holds the counter value at the last value produced during the measurement window. The signal 608 shows that FSM 216 also samples the counter value during the same period. Accordingly, the FSM 216 samples the counter value when the signal 608 is at a logical 0 and does not sample the counter value when the signal 608 is at a logical 1. To sample the counter value, the FSM 216 may perform a read operation to a register in memory that stores the current counter value. In such examples, the asynchronous counter circuitry 214 updates the counter value by writing new data to the register.

The signal 612 represents $V_{OD}$, the static voltage provided to the HSC circuitry 208 by the offset DAC circuitry 210. The signal 614 represents $(V_{OUT(P)}-V_{OUT(N)}$ and is an example of how the magnitude of the $V_{OUT}$ signal changes over time. The signals 612 and 614 are overlaid on top of one another to show that, while the magnitude of the $V_{OUT}$ signal changes regularly to reflect the underlying information being transmitted, only some of the local minima and local maxima in the signal 612 are greater than $V_{OD}$. The signal 616 is an example implementation of $V_{SLICE}$, the output that the HSC circuitry 208 would produce responsive to the inputs of the signals 612 and 614. As described above, the signal 616 shows that $V_{SLICE}$ is a logical 1 when $(V_{OUT(P)}-V_{OUT(N)})$ is greater than $V_{OD}$ and at a logical 0 when $(V_{OUT(P)}-V_{OUT(N)})$ is less than $V_{OD}$.

The first sub-timeline begins at T1. The timestamp T1 occurs after the FSM 216 has set the gain of the VGA circuitry 204 to a first value, implemented a measurement window, and sampled the subsequent counter value. The FSM 216 uses the sampled counter value to determine to change the gain from the first value to the second value. The first sub-timeline shows that the FSM 216 waits for a period after changing the gain before moving the START/STOP signal 604 to a logical 0 (thereby starting the next measurement window). The period between changing the gain and starting the measurement window is labeled $T_{SETTLE}$ and allows for the change to fully propagate through the AGC loop 220 (e.g., for the $V_{OUT}$ signal to settle at a new voltage range responsive to the new gain value). The FSM 216 sets the reset_counter signal 606 to a logical 1 during the $T_{SETTLE}$ period, thereby resetting the counter value to zero.

The second measurement window of FIG. 6, used to evaluate the magnitude of $V_{OUT}$ signal when the gain of the VGA circuitry 204 is at the second value, begins once the TSETTLE period ends. The first sub-timeline shows that the asynchronous counter circuitry 214 increments the counter value in response to: a) the START/STOP signal 604 being at a logical 0, and b) the $V_{SLICE}$ signal 616 having a rising edge (e.g., a transition from a logical 0 to a logical 1).

In the example of FIG. 6, the second measurement window remains at a logical 0, and the asynchronous counter circuitry 214 continues to increment the counter value, through the timestamps T2 and T3. Within the second sub-timeline, the signal 610 shows that by the time the $T_{MEASURE}$ has ended, the counter value has reached 24. The asynchronous counter circuitry 214 holds the counter value at 24 once the START/STOP signal 604 transitions to a logical 1. The hold period allows the FSM 216 within the digital control circuitry 218 to sample the counter value at 24 despite the analog $V_{SLICE}$ signal 606 continuing to change values at a comparatively high speed.

The second sub-timeline shows that after sampling the counter value, the FSM 216: a) uses the value of 24 to select a third gain value for the VGA circuitry 204, and b) resets the counter value to prepare for a third measurement window. The AGC loop 220 may repeat the technique shown in FIG. 6 and described above until the binary search technique implemented by the FSM 216 converges on the optimal gain value described above.

FIG. 7 is a graph illustrating an example performance of the Finite State Machine (FSM) circuitry of FIG. 2. The graph includes time on the x axis and voltage on the y axis. The graph plots an example signal 700 that represents the magnitude of the differential output voltage (e.g., $(V_{OUT(P)}-V_{OUT(N)})$). The graph also includes dashed lines showing various potential values of $V_{OD}$ and corresponding counter values.

In examples described herein, $V_{OD}$ is a static value that represents the boundary between linear and nonlinear regions as described above in connection with FIG. 3. However, different instances of the linear redriver circuitry 108A may implement different $V_{OD}$ values. A designer or manufacturer may choose a value for $V_{OD}$ for a given instance of the linear redriver circuitry 108A responsive to performance requirements provided by a customer, the robustness of the electrical components that implement the redriver circuitry, etc.

To find the optimal gain value, the FSM 216 changes the gain on the VGA circuitry 204 to scale the signal 700 upwards or downwards. Accordingly, an increase to the gain causes the magnitude of $(V_{OUT(P)}-V_{OUT(N)}$ to increase and a decrease to the gain causes the magnitude of $(V_{OUT(P)}-V_{OUT(N)}$ to decrease. The FSM 216 adjusts the gain value with the goal of scaling the signal 700 so that the global maximum of the signal 700 (e.g., the largest output voltage swing exhibited at the current gain value) is approximately equal to $V_{OD}$.

For example, suppose that the graph of FIG. 7 shows the $V_{OUT}$ signal 700 during a measurement window initiated by the FSM 216, and that $V_{OD}$=900 mV. By the end of the measurement window in such an example, the counter value equals seven because there are seven instances where the signal 700 has a rising edge (e.g., where the signal 700 transitions from less than 900 mV to greater than 900 mV). The counter value of seven means that the current gain value is too large because the magnitude of the differential output voltage is regularly exceeding $V_{OD}$. In such an example, the FSM 216 would decrease the gain for the next measurement window in order to scale the magnitude of $V_{OUT}$ signal 700 down and bring the redriver circuitry back into the linear range of operations.

As another example, suppose instead that $V_{OD}$=1500 mV. By the end of the measurement window in such an example, the counter value equals zero because FIG. 7 shows the signal 700 never exceeds 1500 mV. The counter value of zero means that the current gain value is too small because the magnitude of the output voltage swing can be increased while still remaining in the linear region of operations. Accordingly, in such examples, the FSM 216 would increase the gain value for the next measurement window.

As a third example, suppose that $V_{OD}$=1300 mV. Such an offset would cause the counter value to be three because there are three instances of the signal 700 transitioning from below the line $V_{OD}$=1300 mV to above the line $V_{OD}$=1300 mV. In some examples, the FSM 216 may consider the current gain setting to be optimal because: a) some but not all of the local maxima cross 1300 mV, and b) the amount of time the signal spends above 1300 mV is comparatively short. Accordingly, the FSM 216 knows that the output voltage swing is regularly near, but rarely exceeding, the boundary between the linear and nonlinear regions. Moreover, the current gain setting may be considered ideal if previous measurement windows indicate that other gain settings would cause the signal 700 to exceed $V_{OD}$ too frequently or too infrequently. The techniques used by the FSM 216 to analyze the current counter value, responsive to the history of previous counter values obtained from previous measurement windows, is described further in connection with FIG. 11.

Notably, the linear redriver circuitry 108A does not begin to lose or corrupt data immediately after entering the non-linear region defined by ($V_{OUT(P)}$−$V_{OUT(N)}$>$V_{OD}$. Rather, a manufacturer of the linear redriver circuitry 108A knows the FSM 216 may cause the magnitude of the $V_{OUT}$ signal to occasionally exceed $V_{OD}$ for brief periods and by small amounts. Therefore, the manufacturer can select $V_{OD}$ at a voltage where the redriver circuitry 108A can produce reliable and accurate signals whenever ($V_{OUT(P)}$−$V_{OUT(N)}$)<($V_{OD}$+x V), where x V is a margin of error.

Figure 8:
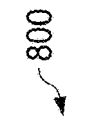
FIG. 8 is a graph illustrating a first use case implemented by the peak detector circuitry of FIG. 2.
Figure 9:
FIG. 9 is a graph illustrating a second use case implemented by the peak detector circuitry of FIG. 2.

FIG. 8 is a graph illustrating a first use case implemented by the peak detector circuitry 222 of FIG. 2. FIG. 9 is a graph illustrating a second use case implementation by the peak detector circuitry 222 of FIG. 2. Both the graph 800 of FIG. 8 and the graph 900 of FIG. 9 include example signals 802, 804, and 808. The graph 800 also includes an example signal 806, and the graph 900 includes an example signal 806.

In both FIG. 8 and FIG. 9, the signal 802 represents VSOURCE, the voltage output by the TX driver circuitry 200 after performing TX FFE operations as described above in connection with FIG. 2. The signal 804 represents the input voltage swing of the linear redriver circuitry 108A (e.g., ($V_{IN(P)}$−$V_{IN(N)}$). The signal 804 is an attenuated version of the signal 802 due to the loss that occurs as the signal travels from the router circuitry 106A to the linear redriver circuitry 108A. Furthermore, in both FIG. 8 and FIG. 9, the signal 808 is an example implementation of $V_{OD}$.

The signal 806 of FIG. 8 and the signal 906 of FIG. 9 represent two possible implementations of the differential output voltage (e.g., ($V_{OUT(P)}$−$V_{OUT(N)}$)) responsive to the signals 802, 804, and 808. A given peak (e.g., local maxima) within the signals 806 and 906 are an analog representation of one bit.

While the AEQ operations performed with the digital control circuitry 218 and the CTLE circuitry 202 can be necessary to recover signals with high loss (e.g., a comparatively large amount of signal attenuation), performing the AEQ operations by themselves can mitigate some or all signal shaping effects of the TX FFE operations. In the example of FIG. 8, the digital control circuitry 218 only performs the AEQ operations to adjust the EQ setting of the CTLE circuitry before performing AGC operations (e.g., initiating the AGC loop 220) to adjust the gain settings of the VGA circuitry 204. As a result, all bits have approximately the same output voltage swing and the magnitude of said output voltage is close to the $V_{OD}$ signal. However, the shape of the output voltage signal 806 is comparatively dissimilar to the shape of the VSOURCE signal 802, and the effects of the previously performed TX FFE operations have been lost.

In the example of FIG. 9, the digital control circuitry 218 intentionally over-equalizes the CTLE circuitry 202. The digital control circuitry 218 performs the over-equalization by first performing the AEQ operations as described above. After the AE operations are complete, the digital control circuitry 218 then adds an offset to the value of the EQ setting (e.g., increases the EQ value). After equalization, the digital control circuitry 218 then performs AGC operations to adjust the gain setting of the VGA setting. The result of the foregoing operations is the output voltage signal 906. Compared to the signal 806, the signal 906 does not reach as close to the $V_{OD}$ signal 808 (see, e.g., the local maxima around timestamps 14.9 nanoseconds (ns), 17.1 ns, and 17.7 ns in both of FIGS. 8 and 9). However, the shape of the signal 906 is more similar to the VSOURCE signal 802 than the signal 806 (see, e.g., the peak at approximately 16.4 ns in both FIGS. 8 and 9). Accordingly, the signal 906 maintains the effect of the TX FFE operations in that higher frequency portions of the source signal have a higher output voltage swing. More generally, a manufacturer can predetermine how much over-equalization the digital control circuitry 218 performs to maintain a balance between increasing SDNR and maintaining the effects of TX FFE to match the shape of the signal.

Figure 10:
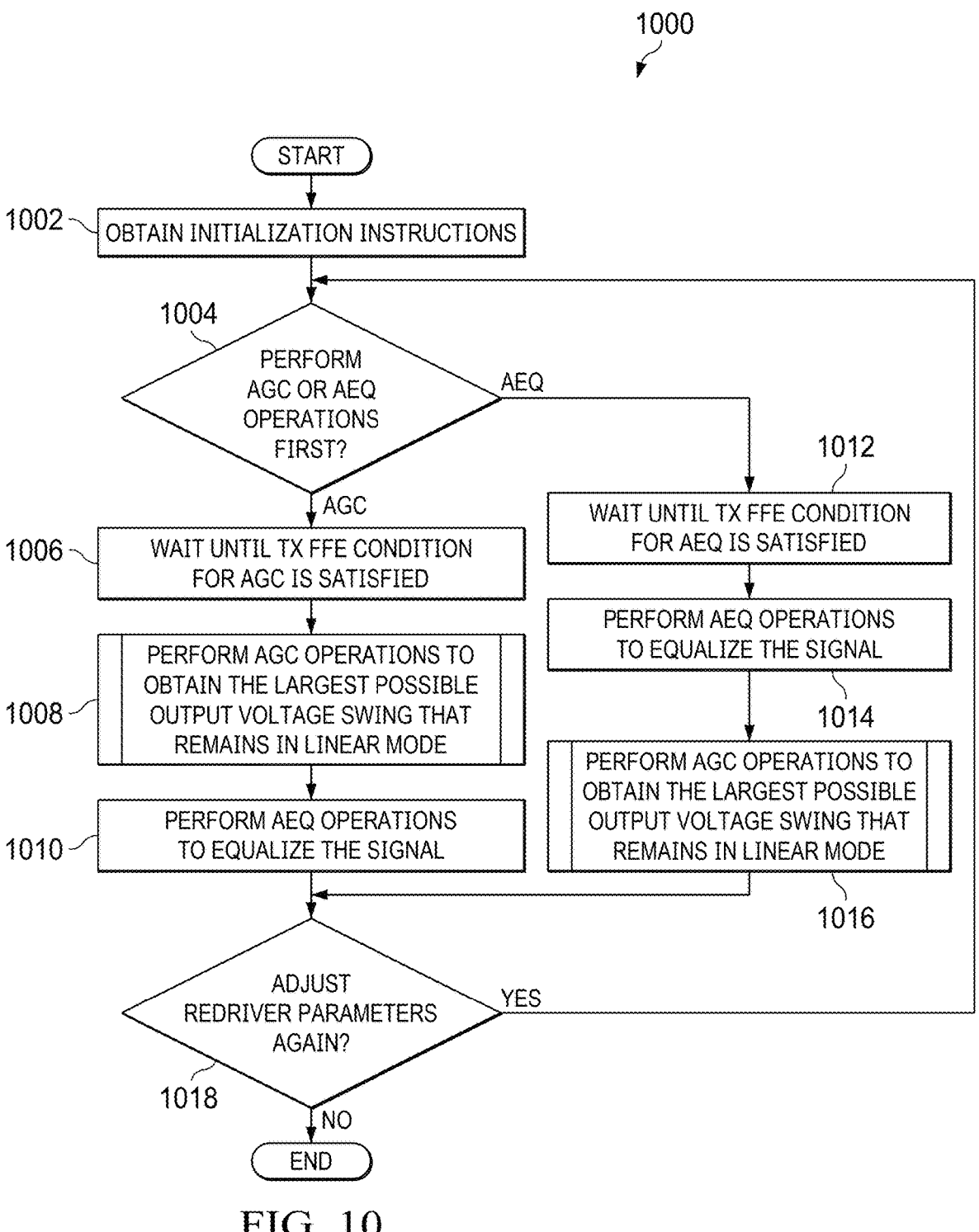
FIG. 10 is a flowchart representative of example machine-readable instructions or example operations that may be at least one of executed, instantiated, or performed using an example programmable circuitry implementation of the peak detector circuitry of FIG. 2.

FIG. 10 is a flowchart representative of example machine-readable instructions or example operations 1000 that may be at least one of executed, instantiated, or performed by programmable circuitry to adjust parameters of the linear redriver circuitry 108A. The example machine-readable instructions or the example operations 1000 begin when the digital core obtains initialization instructions. (Block 1002). In some examples, the digital control circuitry 218 obtains some or all of the initialization instructions through a standardized communication interface (e.g., an Inter-Integrated Circuit (I2C) bus) with an external device. The digital control circuitry 218 may also obtain some or all of the initialization instructions by reading predetermined values from an internal memory.

The initialization instructions define how the digital control circuitry 218 performs AEQ and AGC operations. For example, the initialization instructions describe whether the digital control circuitry 218 is to perform the AEQ operations or the AGC operations first. If the initialization instructions indicate the digital control circuitry 218 is to perform the AGC operations first, it also provides an EQ setting to use on the CTLE circuitry 202 while the AGC loop 220 runs. Similarly, if initialization instructions indicate the digital control circuitry 218 is to perform the AEQ operations first, it also provides a gain value to use on the VGA circuitry 204 during the AEQ operations. The initialization instructions also provide a target amplitude (e.g., the value of $V_{OD}$) for use during the AGC operations. The initialization instructions also provide the digital control circuitry 218 condition data describing when to begin AGC or AEQ operations responsive to TX FFE settings. This condition data is described below in connection with blocks 1006 and 1012.

The digital control circuitry 218 uses the initialization instructions to determine whether to perform the AGC or AEQ operations first. (Block 1004). If the instructions cause the digital control circuitry 218 to perform AGC operations first, the digital control circuitry 218 waits until a TX FFE condition corresponding to AGC is satisfied. (Block 1006).

As used above and herein, TX FFE settings refer to internal parameters within the router circuitry 106A that influence how the TX driver circuitry 200 performs TX FFE operations. Such TX FFE settings may include, but are not limited to, the values of the time delay components and constants within the FIR filter of FIG. 2.

Determining what TX FFE settings to implement in a given settings can depend on a wide number of factors including but not limited to the properties of the transmitting device, the properties of the receiving device, the distance between the two devices, characteristics of the transmission medium, etc. Therefore, when two devices connect in an environment like FIG. 1, some communication standards (e.g., USB 4) implement a negotiation period where the transmitting device (e.g., the system board 102A) and the receiving device (e.g., the system board 102B) coordinate to determine what TX FFE settings will be used during the main communication period. As an example, during the negotiation period within the USB 4 protocol, the system board 102A transmits multiple test messages at different TX FFE settings and the system board 102B performs bit error rate tests to evaluate the quality of the various TX FFE settings.

Whenever the router circuitry 106A changes the TX FFE settings during the negotiation period, the USB4 protocol includes a subsequent period of time to optionally adjust the parameters of the linear redriver circuitry 108A responsive to the new TX FFE settings. Accordingly, the initialization instructions can cause the digital control circuitry 218 to begin AGC operations: a) as soon as it receives a nonzero value in the $V_{IN}$ signal, regardless of whether any TX FFE operations have begun, b) after the first instance that TX FFE settings are used, or c) each time the TX FFE settings change within the negotiation period. At block 1006, the digital control circuitry 218 waits for one of the three foregoing conditions to be satisfied before performing further operations.

After the TX FFE condition provided in the initialization instructions for AGC has been satisfied, the digital control circuitry 218 causes the AGC loop 220 to perform AGC operations to obtain the largest possible output voltage swing that remains in linear mode. (Block 1008). As described above, the AGC operations include the HSC circuitry 208 reporting when ($V_{OUT(P)}-V_{OUT(N)}>V_{OD}$), the asynchronous counter circuitry 214 using an interpretable signal provided by the divider circuitry 212 to update a counter value during a measurement window, and the FSM 216 updating the gain value of the VGA circuitry 204 responsive to the counter value. During the AGC operations, the digital control circuitry 218 sets the CTLE circuitry 202 to a predetermined equalization setting provided within the initialization instructions. Block 1008 is described further in connection with FIG. 11.

After the AGC operations, the digital core performs AEQ operations to equalize the signal. (Block 1010). The signal is considered equalized when the frequency domain attributes of the original signal from the signal sources of the system board 102A are faithfully reproduced in the $V_{OUT}$ signal transmitted to the retimer circuitry 110A. The digital control circuitry 218 performs the AEQ operations by adjusting the EQ setting using any suitable equalization technique. In some examples, the digital control circuitry 218 over-equalizes the signal at block 1010 by increasing the EQ setting after the AEQ operations have completed. Control proceeds to block 1018 after block 1010.

Alternatively, if the initialization instructions at block 1004 instead instruct the digital core to perform AEQ operations first, the digital control circuitry 218 waits until a TX FFE condition corresponding to AGC is satisfied. (Block 1012). The initialization instructions can cause the digital control circuitry 218 to begin AEQ operations: a) as soon as it receives a nonzero $V_{IN}$ signal, regardless of whether any TX FFE operations have begun, b) after the first instance that TX FFE settings are used, or c) each time the TX FFE settings change within the negotiation period. Notably, the digital control circuitry 218 performs the AGC operations and the AEQ operations independently from one another. As a result, the initialization instructions may include a first TX FFE condition if the AGC operations are performed first (e.g., for use at block 1006), and a second, different TX FFE condition if the AEQ operations are performed first (e.g., for use at block 1012).

After the TX FFE condition corresponding to AEQ has been satisfied, the digital control circuitry 218 performs the AEQ operations to equalize the signal as described above in connection with block 1010. (Block 1014). The digital control circuitry 218 may optionally over-equalize the signal at block 1014.

After equalization, the digital control circuitry 218 causes the AGC loop 220 to perform AGC operations to obtain the largest possible output voltage swing that remains in linear mode. (Block 1016). Like block 1008, block 1016 is described further in connection with FIG. 11. However, while the EQ setting used by the CTLE circuitry 202 during block 1008 is provided in the initialization settings, the EQ setting used by the CTLE circuitry 202 during block 1016 is determined through the AEQ operations (and optional over-equalization) of block 1014.

After either block 1010 or 1016, the digital control circuitry 218 determines whether to adjust the redriver parameters again. (Block 1018). The digital control circuitry 218 may re-adjust the redriver parameters for any reason. For example, if the initialization instructions select the TX FFE condition in which the linear redriver circuitry 108A adjusts parameters after every change in TX FFE settings, the digital control circuitry 218 decides to re-adjust parameters at block 1018 in response to determining that TX FFE settings have changed since the last time AGC or AEQ operations were performed. In another example, the digital control circuitry 218 decides to re-adjust the redriver parameters in response to the router circuitry 106A receiving a different input signal from a different source within the system board 102A. If the digital control circuitry 218 determines to adjust the redriver parameters again (Block 1018: Yes), control returns to block 1004 to determine which operations are performed first. If the digital control circuitry 218 does not re-adjust the redriver parameters (Block 1018: No), the machine-readable instructions or operations 1000 end.

Figure 11:
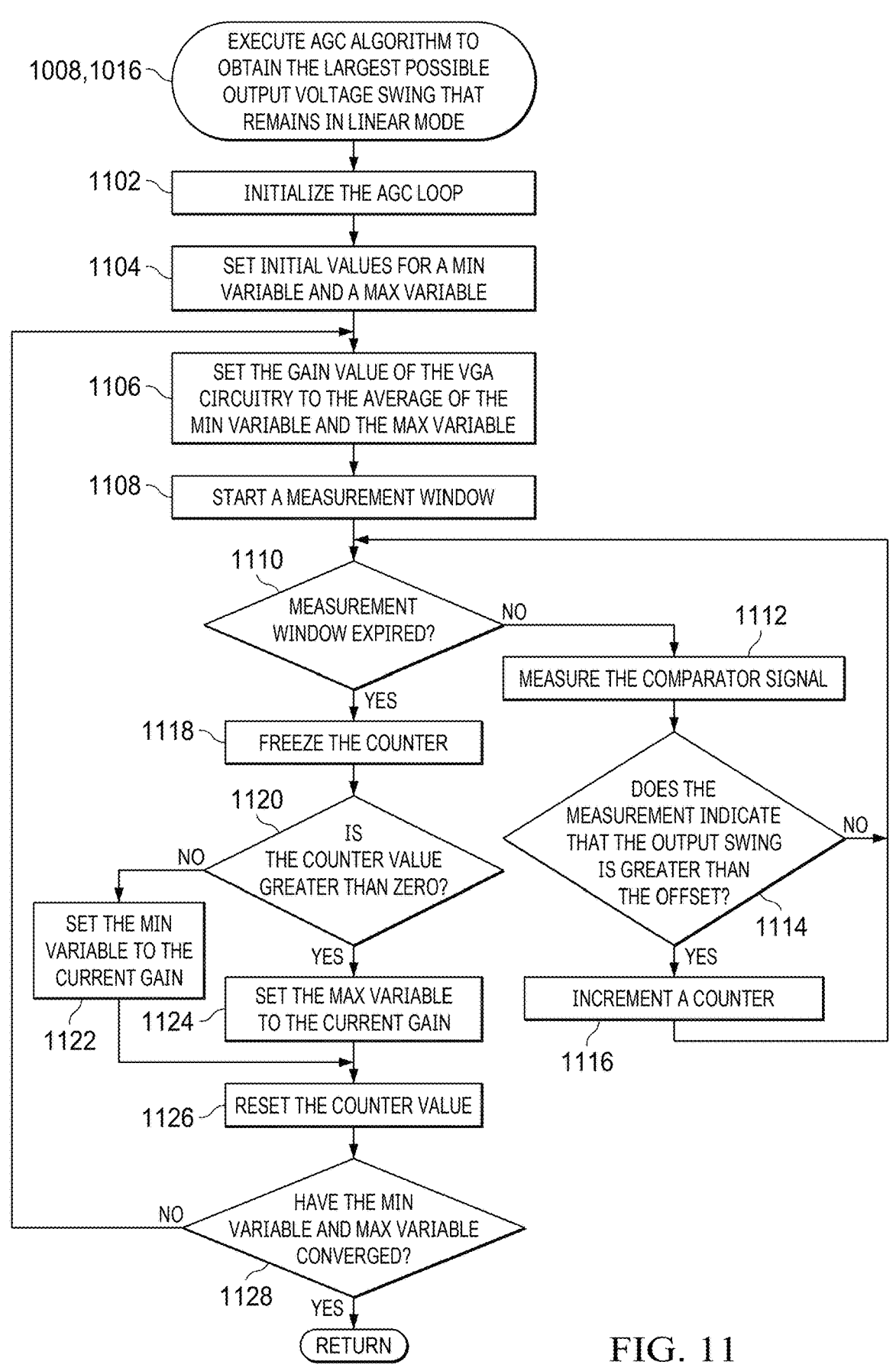
FIG. 11 is a flowchart representative of example machine-readable instructions or example operations that may be at least one of executed, instantiated, or performed using an example programmable circuitry to perform adaptive gain control (AGC) operations as described in FIG. 10.

FIG. 11 is a flowchart representative of example machine-readable instructions or example operations that may be at least one of executed, instantiated, or performed using an example programmable circuitry to perform adaptive gain control (AGC) operations as described in FIG. 10. In particular, the flowchart of FIG. 11 is an example implementation of blocks 1008 and 1016.

Execution of blocks 1008 and 1016 begins when the digital control circuitry 218 initializes the AGC loop 220. (Block 1102). Such initialization may include enabling the logic and electrical components within the peak detector circuitry 222 (e.g., the HSC circuitry 208, the offset DAC circuitry 210, the divider circuitry 212, the asynchronous counter circuitry 214, and the FSM 216). Enabling operations may include, but are not limited to, powering components on, sending wake signals, providing reference voltages, etc. The digital control circuitry 218 also waits an amount of time for the components within their AGC loop 220 to settle. A component has considered settled when it has completed any initialization procedures and is ready to perform AGC operations. In examples where AEQ operations are performed before AGC operations, the digital control circuitry 218 may initialize the AGC loop once before the equalization occurs (e.g., block 1014) instead of performing the operations later in block 1102. Such initialization occurs before equalization because, in some examples, the linear redriver circuitry 108A uses some or all of the peak detector circuitry 222 during both AEQ and AGC operations.

After initialization, the FSM 216 sets initial values for a minimum variable (referred to herein as $VAR_{MIN}$) and a maximum variable (referred to herein as $VAR_{MAX}$). (Block 1104). Throughout the flowchart of FIG. 11, $VAR_{MIN}$ represents a gain setting of the VGA circuitry 204 that the FSM 216 knows is less than the optimal gain setting (e.g., the largest possible gain setting that stays in linear mode). Similarly, $VAR_{MAX}$ represents a gain setting of the VGA circuitry 204 that the FSM 216 knows is greater than the optimal gain setting. At block 1104, the FSM 216 has yet to run a measure window and therefore has no knowledge of which gain setting is preferred for the current use cause. As a result, the initial value for $VAR_{MIN}$ represents the smallest possible gain setting available on the VGA circuitry 204 and the initial value for $VAR_{MAX}$ represents the largest possible gain setting.

The FSM 216 sets the gain value of the VGA circuitry 204 to the average of $VAR_{MIN}$ and $VAR_{MAX}$. (Block 1106). For example, in the first iteration of block 1106, the average $VAR_{MIN}$ and $VAR_{MAX}$ represent a value in the middle of the range of available gain settings.

The FSM 216 starts a measurement window. (Block 1108). In the example of FIG. 6, the FSM 216 starts the measurement window by transitioning the START/STOP signal 604 to a logical 0. In other examples, the FSM 216 starts the measurement window using a different technique.

The FSM 216 determines whether the measurement window has expired. (Block 1110). The FSM 216 implements all measurement windows for the same amount of time (e.g., $T_{MEASURE}$ in FIG. 6) so that count values from different measurement windows can be compared against each other. Accordingly, the FSM 216 may implement block 1110 by determining whether the number of clock pulses that have occurred since the start of the measurement window exceeds a threshold.

If the measurement window has not expired (Block 1110: No), the asynchronous counter circuitry 214 measures the comparator signal. (Block 1112). The comparator signal of block 1112 refers to the output of the divider circuitry 212, a version of the HSC circuitry 208 output that is slowed down such that it can be interpreted by the digital control circuitry 218. Accordingly, the comparator signal describes the relationship between $(V_{OUT(P)}-V_{OUT(N)})$ and $V_{OD}$.

In the example of FIG. 9, the initialization instructions set the SIGN signal of muxes 510 and 512 to option 'A' as described in connection with FIG. 5A. Accordingly, the asynchronous counter circuitry 214 determines whether the measurement indicates that the output voltage is greater than the offset (e.g., whether $(V_{OUT(P)}-V_{OUT(N)})>V_{OD}$). (Block 1114). Accordingly, option 'A' of the SIGN signal causes the AGC loop 220 to compare the local maximums of the differential $V_{OUT}$ signal to a positive offset value, as shown in FIG. 7. If the SIGN signal instead set the muxes 510 and 512 to option 'B', the asynchronous counter circuitry 214 would instead determine whether the measurement indicates that $(V_{OUT(P)}-V_{OUT(N)})<-V_{OD}$. Accordingly, option 'B' of the SIGN signal causes the AGC loop 220 to compare the local maximums of the differential $V_{OUT}$ signal to a positive offset value. The initialization instructions may choose either option 'A' or 'B' or cause the FSM 216 to periodically switch the value of the SIGN signal in between measurement windows, as described above in connection with FIG. 5.

In the example of FIG. 9, if the measurement does not indicate that the output voltage is greater than the offset (Block 1114: No), control returns to block 1110. Alternatively, if the measurement does indicate that the output voltage is greater than the offset (Block 1114: Yes), the asynchronous counter circuitry 214 increments the counter value. (Block 1116). During the initialization operations of block 1102, the digital control circuitry 218 sets the counter value to begin the loop of blocks 1106-1128 at zero. Control returns to block 1110 after block 1116.

The AGC loop 220 repeats the loop of blocks 1110-1116 until the measurement window expires. After the measurement window expires (Block 1110: No), the FSM 216 freezes the counter value so that the counter value can be sampled. (Block 1118). Freezing the counter value prevents any situation where, due to the difference in speeds between the HSC circuitry 208 and the digital control circuitry 218, the asynchronous counter circuitry 214 updates the counter value after the measurement window expires but before the value can be read by the FSM 216.

The FSM 216 determines whether the frozen counter value is greater than zero. (Block 1120). If the counter value is zero (Block 1120: No), the current gain value is too small because the gain can be increased while staying within the linear region. Accordingly, in such examples, the FSM 216 sets $VAR_{MIN}$ equal to the current gain setting. (Block 1122). The change causes future iterations of the loop of block 1106-1128 to only consider gain values that are greater than the current gain setting. Control proceeds to block 1126 after block 1122.

Alternatively, if the frozen counter value is greater than zero (Block 1120: Yes), the FSM 216 considers the current gain value too large because the redriver operated in the nonlinear region at least once during the measurement window. Accordingly, in such examples, the FSM 216 sets $VAR_{MAX}$ equal to the current gain setting. (Block 1124). The change causes future iterations of the loop of block 1106-1128 to only consider gain values that are less than the current gain setting.

After either blocks 1122 or 1124, the FSM 216 resets the counter value (Block 1126) so it starts the next measurement window at zero. The FSM 216 then determines whether the $VAR_{MIN}$ and $VAR_{MAX}$ have converged. (Block 1128). Because the FSM 216 only increases the $VAR_{MIN}$ and only decreases $VAR_{MAX}$, the value of $(VAR_{MAX}-VAR_{MIN})$ decreases with each iteration of blocks 1106-1128. The variables are considered to have converged when an additional to change to either variable would cause $VAR_{MIN}>VAR_{MAX}$.

If the variables have not converged (Block 1128: No), control returns to block 1106 where the FSM 216 selects a new gain value for the VGA circuitry by taking an average of the updated $VAR_{MIN}$ and $VAR_{MAX}$. Alternatively, if the variables have converged (Block 1128: Yes), the current gain setting is considered optimal because the output voltage swing is as large as possible while remaining in the linear mode. Accordingly, control returns to either block 1010 or block 1018 of FIG. 10 in such examples.

Figure 12:
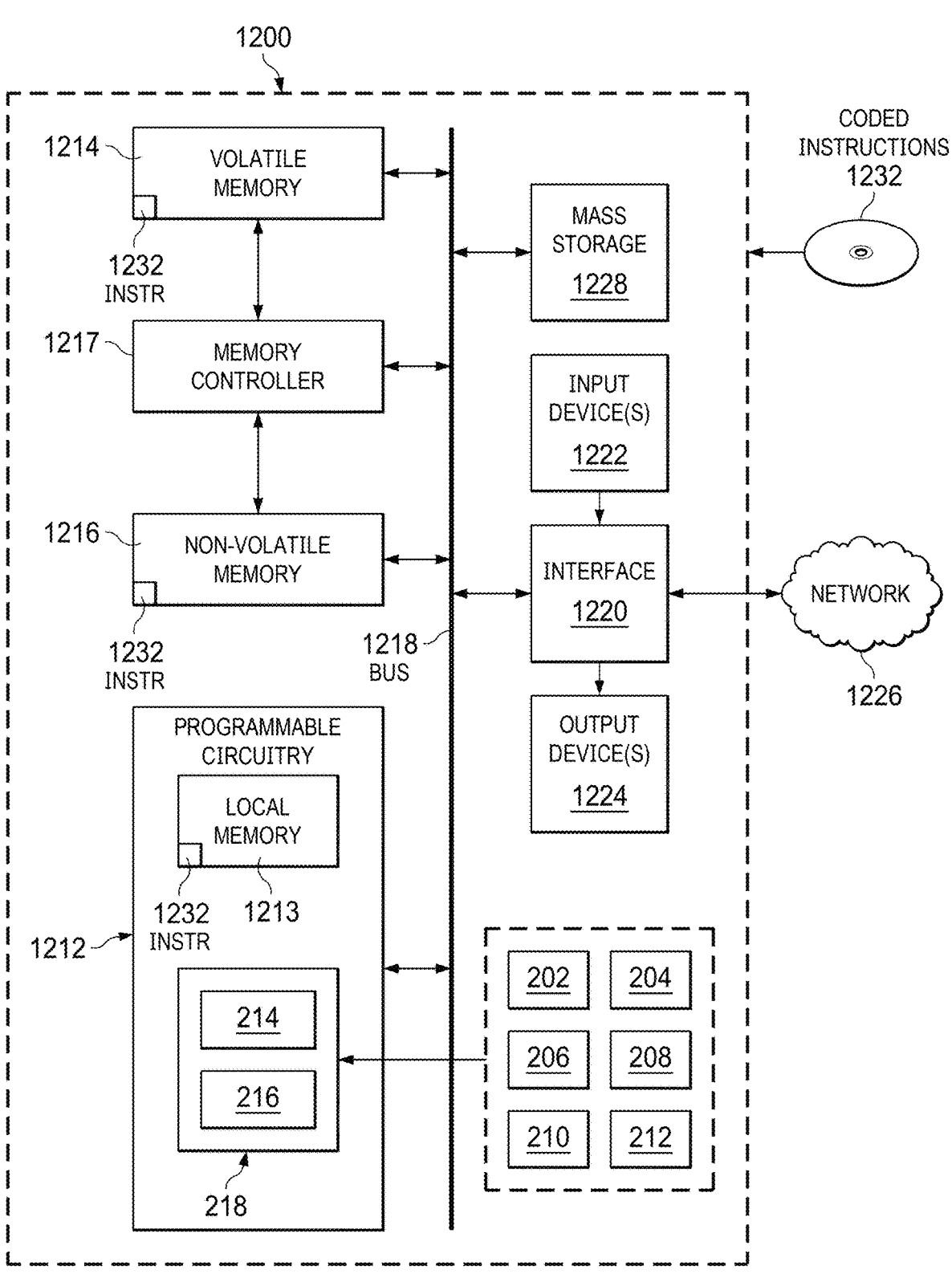
FIG. 12 is a block diagram of an example processing platform including programmable circuitry structured to execute, instantiate, or perform the example machine-readable instructions or perform the example operations of FIGS. 10 and 11 to implement the linear redriver circuitry 108A of FIG. 2.

FIG. 12 is a block diagram of an example programmable circuitry platform 1200 structured to one or a combination of execute or instantiate one or more of the example machine-readable instructions or the example operations of FIGS. 10 and 11 to implement the linear redriver circuitry 108A of FIG. 2. The programmable circuitry platform 1200 can be, for example, implemented within a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing or electronic device.

The programmable circuitry platform 1200 of the illustrated example includes programmable circuitry 1212. The programmable circuitry 1212 of the illustrated example is hardware. For example, the programmable circuitry 1212 can be implemented by one or more integrated circuits, logic circuits, FPGAs, microprocessors, CPUs, GPUs, DSPs, or microcontrollers from any desired family or manufacturer. The programmable circuitry 1212 may be implemented by one or more semiconductor based (e.g., silicon based) devices. In this example, the programmable circuitry 1212 implements the asynchronous counter circuitry 214, the FSM 216, and, more generally, the digital control circuitry 218.

The programmable circuitry 1212 of the illustrated example includes a local memory 1213 (e.g., a cache, registers, etc.). The programmable circuitry 1212 of the illustrated example is in communication with main memory 1214, 1216, which includes a volatile memory 1214 and a non-volatile memory 1216, by a bus 1218. The volatile memory 1214 may be implemented by one or more Synchronous Dynamic Random Access Memory (SDRAM), Dynamic Random Access Memory (DRAM), RAMBUS® Dynamic Random Access Memory (RDRAM®), or any other type of RAM device. The non-volatile memory 1216 may be implemented by one or a combination of flash memory or any other desired type of memory device. Access to the main memory 1214, 1216 of the illustrated example is controlled by a memory controller 1217. In some examples, the memory controller 1217 may be implemented by one or more integrated circuits, logic circuits, microcontrollers from any desired family or manufacturer, or any other type of circuitry to manage the flow of data going to and from the main memory 1214, 1216.

The programmable circuitry platform 1200 of the illustrated example also includes interface circuitry 1220. The interface circuitry 1220 may be implemented by hardware in according to any type of interface standard, such as an Ethernet interface, a universal serial bus (USB) interface, a Bluetooth® interface, a near field communication (NFC) interface, a Peripheral Component Interconnect (PCI) interface, or a Peripheral Component Interconnect Express (PCIe) interface.

In the illustrated example, one or more input devices 1222 are connected to the interface circuitry 1220. The input device(s) 1222 permit(s) a user (e.g., a human user, a machine user, etc.) to enter one of or a combination of data or commands into the programmable circuitry 1212. The input device(s) 1222 can be implemented by, for example, one of or a combination of an audio sensor, a microphone, a camera (still or video), a keyboard, a button, a mouse, a touchscreen, a trackpad, a trackball, an isopoint device, or a voice recognition system.

One or more output devices 1224 are also connected to the interface circuitry 1220 of the illustrated example. The output device(s) 1224 can be implemented, for example, by one of or a combination of display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, or speaker. The interface circuitry 1220 of the illustrated example, thus, includes one of or a combination of a graphics driver card, a graphics driver chip, or graphics processor circuitry such as a GPU.

The interface circuitry 1220 of the illustrated example also includes a communication device such as one of or a combination of a transmitter, a receiver, a transceiver, a modem, a residential gateway, a wireless access point, or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 1200 of the illustrated example also includes one or more mass storage discs or devices 1228 to store one or more of firmware, software, or data. Examples of such mass storage discs or devices 1228 include one or more magnetic storage devices (e.g., floppy disk, drives, HDDs, etc.), optical storage devices (e.g., Blu-ray disks, CDs, DVDs, etc.), RAID systems, or solid-state storage discs or devices such as flash memory devices and SSDs.

The machine-readable instructions 1232, which may be implemented by the machine-readable instructions of FIGS. 10 and 11, may be stored in one of or a combination of the mass storage device 1228, in the volatile memory 1214, in the non-volatile memory 1216, or on at least one non-transitory computer readable storage medium such as a CD or DVD which may be removable.

Flowchart(s) representative of example machine-readable instructions, which may be executed by programmable circuitry to at least one of implement or instantiate the linear redriver circuitry 108A of FIG. 2 or representative of example operations which may be performed by programmable circuitry to at least one of implement or instantiate the linear redriver circuitry 108A of FIG. 2, are shown in FIGS. 10 and 11. The machine-readable instructions may be one or more executable programs or portion(s) of one or more executable programs for execution by programmable circuitry such as the programmable circuitry 1212 shown in the example programmable circuitry platform 1200 described below in connection with FIG. 12 and may be one or more function(s) or portion(s) of functions to be performed by the example programmable circuitry (e.g., an FPGA). In some examples, the machine-readable instructions cause an operation, a task, etc., to be carried out or performed in an automated manner in the real-world. As used herein, "automated" means without human involvement.

The program may be embodied in instructions (e.g., software and/or firmware) stored on one or more non-transitory computer readable and/or machine-readable storage medium such as one of or a combination of cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EE-PROM), flash memory, etc.), volatile memory (e.g., Random Access Memory (RAM) of any type, etc.), or any other storage device or storage disk. The instructions of the non-transitory computer readable and/or machine-readable medium may program or be executed by programmable circuitry located in one or more hardware devices, but the entire program or parts thereof could alternatively be executed or instantiated by one or more hardware devices other than the programmable circuitry or embodied in dedicated hardware. The machine-readable instructions may be distributed across multiple hardware devices or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 10 and 11, many other methods of implementing the example linear redriver circuitry 108A may alternatively be used. For example, the order of execution of the blocks of the flowchart(s) may be changed, or some of the blocks described may be changed, eliminated, or combined. Also or alternatively, any or all of the blocks of the flow chart may be implemented by one or more hardware circuits (e.g., processor circuitry, discrete, integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations or local to one or more hardware devices (e.g., a single-core processor (e.g., a single core CPU), a multi-core processor (e.g., a multi-core CPU, an XPU, etc.)). For example, the programmable circuitry may be one of or a combination of a CPU or an FPGA located in the same package (e.g., the same integrated circuit (IC) package or in two or more separate housings), one or more processors in a single machine, multiple processors distributed across multiple servers of a server rack, multiple processors distributed across one or more server racks, etc., or any combination(s) thereof.

The machine-readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, or produce machine executable instructions. For example, the machine-readable instructions may be fragmented and stored on one or more storage devices, disks or computing devices (e.g., servers)

located at the same or different locations of a network or collection of networks (e.g., in the cloud, in edge devices, etc.). The machine-readable instructions may require one or more of installation, modification, adaptation, updating, combining, supplementing, decryption, decompression, unpacking, distribution, reassignment, compilation, etc., in order to make them directly readable, interpretable, or executable by a computing device or other machine. For example, the machine-readable instructions may be stored in multiple parts, which are individually compressed, encrypted, or stored on separate computing devices, such that the parts, when decrypted, decompressed, or combined form a set of one or more computer-executable or machine executable instructions that implement one or more functions or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions or the corresponding program(s) can be executed in whole or in part. Thus, machine-readable, computer readable or machine-readable media, as used herein, may include one or a combination of instructions and program(s) regardless of the particular format or state of the machine-readable instructions or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 10 and 11 may be implemented using executable instructions (e.g., computer readable and/or machine-readable instructions) stored on one or more non-transitory computer readable or machine-readable media. As used herein, the terms non-transitory computer readable medium, non-transitory computer readable storage medium, non-transitory machine-readable medium, and non-transitory machine-readable storage medium are expressly defined to include any type of computer readable storage device or storage disk and to exclude propagating signals and to exclude transmission media. Examples of such non-transitory computer readable medium, non-transitory computer readable storage medium, non-transitory machine-readable medium, or non-transitory machine-readable storage medium include one or more optical storage devices, magnetic storage devices, an HDD, a flash memory, a read-only memory (ROM), a CD, a DVD, a cache, a RAM of any type, a register, or any other storage device or storage disk in which information is stored for any duration (e.g., for extended time periods, permanently, for brief instances, for temporarily buffering, for caching of the information). As used herein, the terms "non-transitory computer readable storage device" and "non-transitory machine-readable storage device" are defined to include any physical (mechanical, magnetic, electromechanical, or electrical) hardware to retain information for a time period, but to exclude propagating signals and to exclude transmission media. Examples of non-transitory computer readable storage devices or non-transitory machine-readable storage devices include one or a combination of random-access memory of any type, read only memory of any type, solid state memory, flash memory, optical discs, magnetic disks, disk drives, or redundant array of independent disks (RAID) systems. As used herein, the term "device" refers to physical structure such as one of or a combination of mechanical, electromechanical, or electrical equipment, hardware, or circuitry that may or may not be configured by computer readable instructions, machine-readable instructions, etc., or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for case of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description.

Modifications are possible in the described embodiments, and other embodiments are possible, within the scope of the claims.

From the foregoing, it will be appreciated that example systems, apparatus, articles of manufacture, and methods have been described that implement a linear redriver circuit that supports incoming signals with differential zero symbols (e.g., incoming signals formatted in PAM 3). Described systems, apparatus, articles of manufacture, and methods improve the efficiency of using a computing device by comparing the magnitude of the differential signal to an offset value, making the foregoing output signal interpretable by a digital core, counting how many times the magnitude of the differential signal exceeded the offset value within a measurement window, and implementing a binary search technique to identify a new gain value for VGA circuitry within the redriver circuitry. When the binary search technique is complete, the finite state machine has identified a gain value that maximizes the magnitude of the output voltage swing (e.g., maximizes the envelope) while keeping the redriver circuitry within the linear range of operations. Described systems, apparatus, articles of manufacture, and methods are also directed to one or more improvement(s) in the operation of a machine such as a computer or other electronic, electromechanical, or mechanical device.

What is claimed is:

1. A redriver device comprising:

variable gain amplifier (VGA) circuitry having an input terminal, an output terminal, and a control terminal; and peak detector circuitry having an input terminal coupled to the output terminal of the VGA circuitry, an output terminal coupled to the control terminal of the VGA circuitry wherein the peak detector circuitry includes:

digital to analog converter (DAC) circuitry having an input terminal, and an output terminal, the DAC circuitry configured to generate an offset voltage;

comparator circuitry having a first input terminal coupled to the output terminal of the VGA circuitry, a second input terminal coupled to the output terminal of the DAC circuitry, and an output terminal, the comparator circuitry configured to compare a voltage on the output terminal of the VGA circuitry to the offset voltage; and programmable circuitry configured to adjust, responsive to the comparison, a gain of the VGA circuitry.

2. The redriver device of claim 1, wherein the programmable circuitry having an input terminal coupled to the output terminal of the comparator circuitry, a first output terminal coupled to the input terminal of the DAC circuitry, and a second output terminal coupled to the control terminal of the VGA circuitry, wherein the programmable circuitry is configured to:

adjust a counter value responsive to a voltage at the output terminal of the comparator circuitry; and provide, responsive to the counter value, the gain to the control terminal of the VGA circuitry.

3. The redriver device of claim 2, wherein the peak detector circuitry further includes divider circuitry having an input terminal coupled to the output terminal of the comparator circuitry; and an output terminal.

4. The redriver device of claim 2, wherein the comparator circuitry includes:

voltage-to-current loop amplifier circuitry having a first input terminal coupled to the DAC circuitry, a second input terminal, and an output terminal;

signed voltage-to-current converter circuitry having a first input terminal coupled to the first output terminal of the voltage-to-current loop amplifier circuitry, a second input terminal coupled to the output terminal of the VGA circuitry, a first output terminal, and a second output terminal coupled to the second input terminal; and slicer circuitry having an input terminal coupled to the first output terminal of the signed voltage-to-current converter circuitry, and an output terminal coupled to the programmable circuitry.

5. The redriver device of claim 4, wherein the voltage-to-current loop amplifier circuitry includes:

amplifier circuitry having a first input terminal coupled to the DAC circuitry, a second input terminal, and an output terminal;

first multiplexer circuitry having an input terminal coupled to the output terminal of the amplifier circuitry, a first output terminal, a second output terminal, and a control terminal configured to receive a sign signal from the programmable circuitry; and second multiplexer circuitry having, a first input terminal, a second input terminal, an output terminal coupled to the second input terminal of the amplifier circuitry, and a control terminal configured to receive the sign signal from the programmable circuitry.

6. The redriver device of claim 5, wherein the signed voltage-to-current converter circuitry includes:

adder circuitry having an input terminal coupled to the VGA circuitry, a second output terminal, a third output terminal, and a fourth output terminal;

a first transistor having a first current terminal coupled to the second output terminal of the adder circuitry, a control terminal coupled to the second output terminal of the first multiplexer circuitry, and a second current terminal coupled to the first input terminal of the first multiplexer circuitry;

a second transistor having a first current terminal coupled to the third output terminal of the adder circuitry, a control terminal coupled to the first output terminal of the first multiplexer circuitry, and a second current terminal coupled to the second input terminal of the first multiplexer circuitry;

a first resistor having a first terminal coupled to the second current terminal of the first transistor, and a second terminal coupled to ground; and a second resistor having a first terminal coupled to the second current terminal of the second transistor, and a second terminal coupled to ground.

7. A redriver device comprising:

equalizer circuitry having an input terminal configured to receive an input signal, an output terminal, and a control terminal;

variable gain amplifier (VGA) circuitry having an input terminal coupled to the output terminal of the equalizer circuitry, an output terminal, and a control terminal;

transmitter driver circuitry having: an input terminal coupled to the output terminal of the VGA circuitry, an output terminal provided to transmit an output signal; and peak detector circuitry having a second input terminal coupled to the output terminal of the transmitter driver circuitry, an output terminal coupled to the control terminal of the VGA circuitry, wherein the peak detector circuitry is configured to:

compare a voltage on the output terminal of the VGA circuitry to an offset voltage; and adjust, responsive to the comparison, a gain value of the VGA circuitry.

8. The redriver device of claim 7, wherein:

the offset voltage is negative; and the peak detector circuitry further includes:

comparator circuitry configured to detect when the output signal crosses beneath the offset voltage;

counter circuitry configured to update a counter value responsive to a number of times the comparator circuitry makes a detection; and a Finite State Machine configured to adjust the gain value based on the counter value.

9. The redriver device of claim 7, wherein:

the offset voltage is positive; and the peak detector circuitry further includes:

comparator circuitry configured to detect when the output signal crosses above the offset voltage;

counter circuitry configured to update a counter value responsive to a number of times the comparator circuitry makes a detection; and a Finite State Machine configured to adjust the gain value based on the counter value.

10. Programmable circuitry comprising:

counter circuitry configured to generate a counter value responsive to a comparison between an output voltage produced by a redriver circuit and an offset voltage; and a Finite State Machine (FSM) configured to adjust a gain of VGA circuitry responsive to the counter value.

11. The programmable circuitry of claim 10, further including a counter configured to:

determine a magnitude of the output signal is greater than the offset voltage; and update a counter value responsive to the comparison, the counter value to indicate how many times the output signal crossed above the offset voltage during a measurement window.

12. The programmable circuitry of claim 11, wherein:

the VGA circuitry is configured to scale the magnitude of the output voltage proportionally to the gain value; and the FSM is configured to increase the gain responsive to a determination the counter value equals zero.

13. The programmable circuitry of claim 12, wherein:

the VGA circuitry operates within a range of gain values; and the FSM is configured to perform a binary search to find the adjusted gain value within the range of possible gain values.

14. The programmable circuitry of claim 10, wherein the FSM is further configured to cause equalizer circuitry to over-equalize an input signal.

15. The programmable circuitry of claim 12, wherein the FSM is configured to perform adaptive equalization (AEQ)

operations to match frequency components of the output signal with frequency components of an input signal.

16. The programmable circuitry of claim 15, wherein the FSM is configured to perform the AEQ operations before adjusting the gain of the VGA circuitry.

17. The programmable circuitry of claim 15, wherein the FSM is configured to:

perform the AEQ operations after adjusting the gain of the
     VGA circuitry; and use a predetermined equalization setting while adjusting
     the gain of the VGA circuitry.

18. The programmable circuitry of claim 15, wherein the FSM performs one or more of the AEQ operations or the adjustments to the gain of the VGA circuitry responsive to a nonzero value in an input signal.

19. The programmable circuitry of claim 15, wherein the FSM performs one or more of the AEQ operations or the adjustments to the gain of the VGA circuitry responsive to a first change in transmit feed forward equalization (TX FFE) settings during a negotiation period.

20. The programmable circuitry of claim 15, wherein the programmable circuitry performs one or more of the AEQ operations or the adjustments to the gain of the VGA circuitry responsive to any change in transmit feed forward equalization (TX FFE) settings.

\* \* \* \* \*